US008874995B2

(12) United States Patent
Blaum et al.

(10) Patent No.: US 8,874,995 B2
(45) Date of Patent: Oct. 28, 2014

(54) PARTIAL-MAXIMUM DISTANCE SEPARABLE (PMDS) ERASURE CORRECTING CODES FOR STORAGE ARRAYS

(75) Inventors: Mario Blaum, San Jose, CA (US);
James L. Hafner, San Jose, CA (US);
Steven R. Hetzler, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/364,390

(22) Filed: Feb. 2, 2012

(65) Prior Publication Data

US 2013/0205181 A1    Aug. 8, 2013

(51) Int. Cl.
*G11C 29/00* (2006.01)
*G06F 11/10* (2006.01)

(52) U.S. Cl.
CPC ......... *G06F 11/1076* (2013.01); *C06F 11/1092* (2013.01)
USPC ........................................... 714/770; 714/6.2

(58) Field of Classification Search
CPC .................. G06F 11/1076; G06F 11/1092
USPC ................. 714/6.24, 769–770, 773, 755–756
See application file for complete search history.

(56) References Cited

U.S. PATENT DOCUMENTS

| | | | |
|---|---|---|---|
| 4,379,259 A | | 4/1983 | Varadi et al. |
| 4,719,628 A * | | 1/1988 | Ozaki et al. .................... 714/755 |
| 5,038,350 A * | | 8/1991 | Mester ........................... 714/755 |
| 5,164,944 A | | 11/1992 | Benton et al. |
| 5,367,652 A * | | 11/1994 | Golden et al. .................... 711/4 |
| 5,499,253 A * | | 3/1996 | Lary ............................... 714/770 |
| 5,751,730 A | | 5/1998 | Mourot |
| 5,862,158 A | | 1/1999 | Baylor et al. |
| 6,138,125 A * | | 10/2000 | DeMoss ................. 707/999.202 |
| 6,141,770 A | | 10/2000 | Fuchs et al. |

(Continued)

FOREIGN PATENT DOCUMENTS

| | | |
|---|---|---|
| CN | 1808374 A | 7/2006 |
| CN | 101183323 A | 5/2008 |

(Continued)

OTHER PUBLICATIONS

Author: IBM TDB; Kerrigan, M.; Shen WW; Taylor, JM Date: Nov. 1, 1983 Publication—IP.com Prior Art Database Technical Disclosure Title: Error Correction Procedure to Correct One Hard and One Soft Error Using a Single Error Correcting Code.

(Continued)

*Primary Examiner* — Steve Nguyen
(74) *Attorney, Agent, or Firm* — Cantor Colburn LLP; Yuseke Kanehira

(57) ABSTRACT

Embodiments of the invention relate to storing data in a storage array. An aspect of the invention includes receiving and arranging read data in array that includes m rows and n columns of entries, with each entry including at least one sector. In the array, mr+s locations are assigned to parity entries, such that each row has at least r parity entries. The parity entries correspond to a partial-maximum distance separable (PMDS) code that allows recovery from up to r erasures in each of the m rows as well as s additional erasures in any locations in the data array, where s is an integer greater than zero. The write data and the associated parity entries are written to the set of storage devices.

22 Claims, 6 Drawing Sheets

(56) References Cited

U.S. PATENT DOCUMENTS

| | | | |
|---|---|---|---|
| 6,851,082 B1 | 2/2005 | Corbett | |
| 6,973,613 B2 | 12/2005 | Cypher | |
| 7,062,604 B1 | 6/2006 | Nanda | |
| 7,073,115 B2 | 7/2006 | English et al. | |
| 7,093,159 B1 | 8/2006 | Nanda | |
| 7,254,754 B2* | 8/2007 | Hetzler et al. | 714/710 |
| 7,350,126 B2* | 3/2008 | Winograd et al. | 714/752 |
| 7,536,627 B2 | 5/2009 | Gross et al. | |
| 7,644,348 B2 | 1/2010 | Longwell et al. | |
| 7,681,104 B1 | 3/2010 | Sim-Tang et al. | |
| 7,747,898 B1 | 6/2010 | Shaw et al. | |
| 8,117,519 B2 | 2/2012 | Ito et al. | |
| 2005/0278568 A1 | 12/2005 | Delaney | |
| 2006/0074995 A1 | 4/2006 | Hafner et al. | |
| 2006/0129873 A1* | 6/2006 | Hafner | 714/5 |
| 2009/0006923 A1 | 1/2009 | Gara et al. | |
| 2009/0013233 A1 | 1/2009 | Radke | |
| 2010/0115335 A1 | 5/2010 | Wylie et al. | |
| 2010/0332730 A1 | 12/2010 | Royer, Jr. et al. | |
| 2011/0041005 A1 | 2/2011 | Selinger | |
| 2011/0041039 A1 | 2/2011 | Harari et al. | |
| 2011/0060864 A1 | 3/2011 | Yoshii et al. | |

FOREIGN PATENT DOCUMENTS

| | | |
|---|---|---|
| WO | WO0161491 A1 | 8/2001 |
| WO | WO0208900 | 1/2002 |
| WO | WO2004040450 A1 | 5/2004 |

OTHER PUBLICATIONS

Author—Anonymous Date: Jun. 15, 2005 Publication: IP.com Prior Art Database Technical Disclosure Title: Method for Preventing Catastrophic Failures in RAID Volumes using Dynamic Reconfiguration.

John g. Elerath et al.; "Enhanced Reliability Modeling of RAID Stoarge Systems"; pp. 1-10; 37th Annual IEEE/IFIP International Conference on Dependable Systems and Networks (DSN '07) 2007.

Blaum et al., "On Lowest Density MDS Codes," Information Theory, IEEE Transactions on, vol. 45, No. 1, pp. 46-59, Jan. 1999.

Chih-Shing Tau et al.; "Efficient Parity Placement Schemes for Tolerating Triple Disk Failures in RAID Architectures"; Proceedings of the17th International Conference on Advanced Information Networking and Applications (AINA•03) 0-7695-Downloaded on May 4, 2010 at 17:41:18 UTC from IEEE Xplore.

Chong-Won Park et al.; "A Multiple Disk Failure Recovery Scheme in RAID Systems" Journal of Systems Architecture 50 (2004) 169-175.

Haruhiko Kaneko et al.; "Three Level Error Control Coding for Dependable Solid State Drives"; Downloaded on May 4, 2010 at 17:21:31 UTC from IEEE Xplore. Restrictions apply. 2008 14th IEEE Pacific Rim International Symposium on Dependable Computing; pp. 1-8.

International Search Report & Written Opinion for PCT/IB2012/050605 dated Jul. 12, 2012.

Jehan-Francois Paris et al.; Using Storage Class Memories to Increase the Reliability of Two-Dimensional RAID Arrays; Downloaded on May 4, 2010 at 15:50:45 UTC from IEEE Xplore.

Kwanghee Park et al.; Reliability and Performance Enhancement Technique for SSD Array Storage System using RAID Mechanism; Downloaded on May 4, 2010 from IEEE Xplore; pp. 140-146.

Jing et al., "A Fast Error and Erasure Correction Algorithm for a Simple RS-RAID," Info-tech and Info-net, 2001, Proceedings, ICII 2001—Beijing, 2001 Internation Conferences on, vol. 3, pp. 333-338.

Nam-Kyu Lee et al.; "Efficient Parity Placement Schemes for Tolerating up to Two Disk Failures in Disk Arrays"; Journal of Systems Architecture 46 (2000) 1383-1402.

PCT International Search Report and Written Opinion; International Application No. PCT/IB2013/050262; International Filing Date: Jan. 11, 2013; Date of Mailing: Jun. 20, 2013, pp. 1-10.

* cited by examiner

|  | Col 0 | Col 1 | ... | Col n-3 | Col n-2 | Col n-1 |
|---|---|---|---|---|---|---|
| Row 0 | $a_{0,0}$ | $a_{0,1}$ | ... | $a_{0,n-3}$ | $a_{0,n-2}$ | $a_{0,n-1}$ |
| Row 1 | $a_{1,0}$ | $a_{1,1}$ | ... | $a_{1,n-3}$ | $a_{1,n-2}$ | $a_{1,n-1}$ |
| ... | ... | ... | ... | ... | ... | ... |
| Row m-3 | $a_{m-3,0}$ | $a_{m-3,1}$ | ... | $a_{m-3,n-3}$ | $a_{m-3,n-2}$ | $a_{m-3,n-1}$ |
| Row m-2 | $a_{m-2,0}$ | $a_{m-2,1}$ | ... | $a_{m-2,n-3}$ | $a_{m-2,n-2}$ | $a_{m-2,n-1}$ |
| Row m-1 | $a_{m-1,0}$ | $a_{m-1,1}$ | ... | $a_{m-1,n-3}$ | $a_{m-1,n-2}$ | $a_{m-1,n-1}$ |

PARTIAL-MAXIMUM DISTANCE SEPARABLE (PMDS) ERASURE CORRECTING CODES FOR STORAGE ARRAYS

BACKGROUND

The present invention relates generally to storage systems, and more specifically, to partial-maximum distance separable (PMDS) erasure correcting codes for storage arrays.

Computer systems utilize data redundancy schemes such as parity computation to protect against loss of data on a storage device. In redundant arrays of independent disks (RAID) systems, data values and related parity values are striped across disk drives. RAID systems are typically used to protect information stored in hard disk drives (HDDs) arrays from catastrophic disk failures. Two popular RAID schemes are RAID 5 which protects against a single catastrophic disk failure and RAID 6 which protects against a double catastrophic disk failure.

Flash devices are a type of solid state non-volatile storage devices that can be electrically erased and reprogrammed in large blocks. Like HDDs, flash devices divide the medium into sectors that are typically 512 bytes. Flash devices further collect sectors into pages with typically eight sectors per page, so that each page contains four thousand or 4 kilobytes (KB). Each sector is protected by an error correcting code (ECC) that corrects a number of errors (typically, single-bit errors, although other possibilities, like byte errors, are also feasible). A popular choice is a Bose-Chaudhuri-Hocquenghem (BCH) code, like an eight bit correcting or fifteen bit correcting BCH code, although many variations are possible. As in HDDs, pages in flash devices may suffer hard errors (HEs). This occurs, for example, when the error correcting capability of the BCH code in a sector of the page is exceeded. As compared to HDDs, exceeding the capability of the BCH code is more likely in flash devices, both as a page nears the end of its write endurance lifetime, or as a page nears the end of its data retention lifetime. Thus, the number of HEs in flash devices may be expected to grow over time, leaving latent HEs on a device.

An array made up of flash devices may encounter a mix of catastrophic device failures combined with possibly more prevalent HEs. For example, use of RAID 5 for protecting information stored in flash devices may result in a device failure when there are latent HEs. Therefore, for a given data stripe (e.g., a data array that is read and/or written as a unit) if a device in a RAID 5 system experiences a catastrophic device failure, and some other device suffers a HE, a RAID 5 system will be unable to retrieve the information in the data stripe. RAID 6 may allow for the data to be retrieved, but RAID 6 requires dedicating an entire second device for parity, which is expensive when the predominant failures are HEs.

BRIEF SUMMARY

Embodiments include a system for storing data in a storage array. Write data is received and arranged in an array that includes m rows and n columns of entries, with each entry including at least one sector. In the array, mr+s locations are assigned to parity entries, such that each row has at least r parity entries. The parity entries correspond to a partial-maximum distance separable (PMDS) code that allows recovery from up to r erasures in each of the m rows as well as s additional erasures in any locations in the data array, where s is an integer greater than zero. The write data and the associated parity entries are written to the set of storage devices.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3 illustrates contents of an encoded block in accordance with an embodiment;

DETAILED DESCRIPTION

Figure 1:
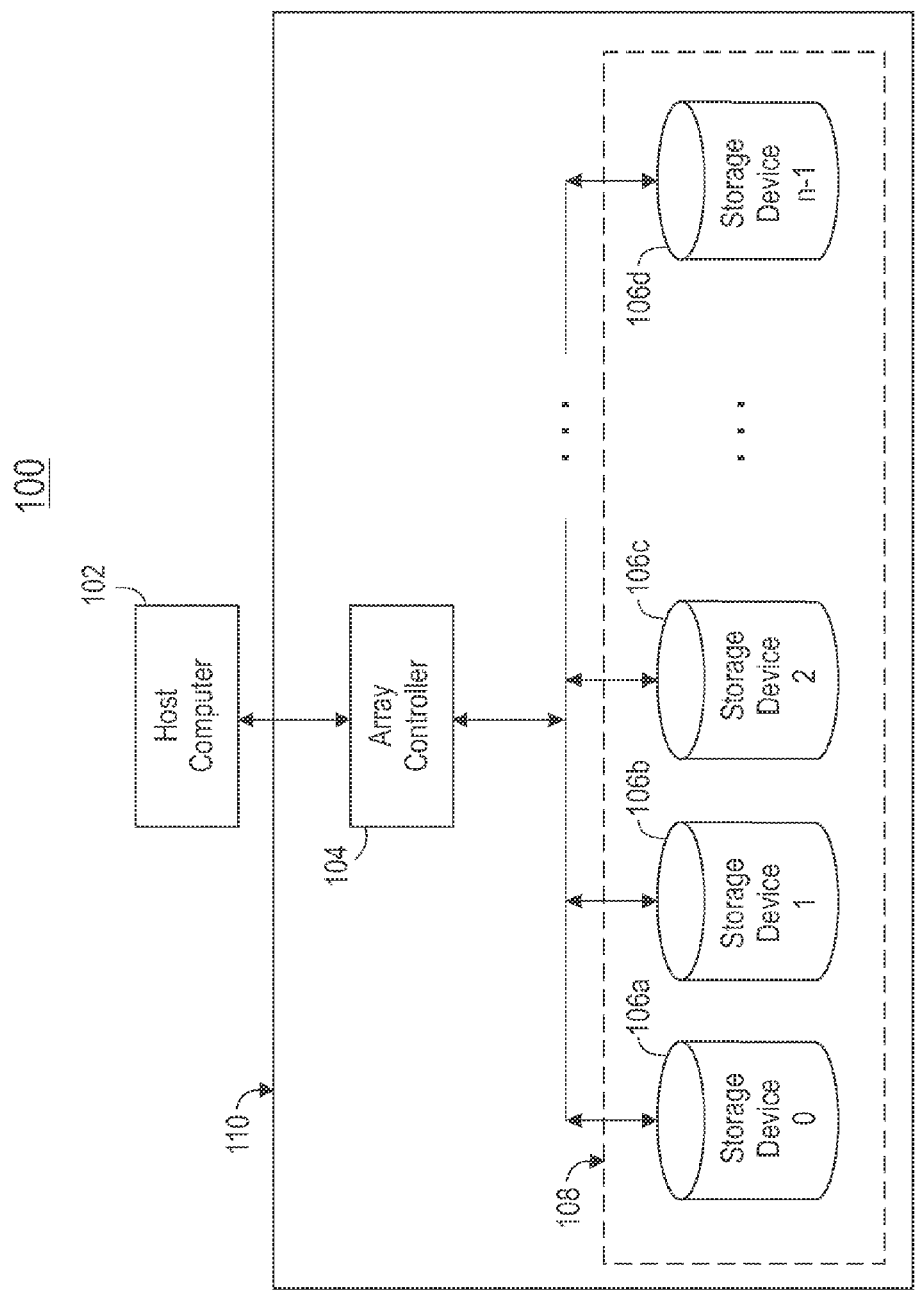
FIG. 1 illustrates a block diagram of a system for providing partial-maximum distance separable (PMDS) codes in accordance with an embodiment.

An embodiment of the present invention is a new family of erasure correcting codes having a two-dimensional structure. These erasure correcting codes are referred to herein as partial-maximum distance separable (PMDS) codes. Embodiments of the PMDS codes described herein can tolerate (i.e., recover from) a catastrophic failure and at least two additional hard errors (HEs), even when the additional HEs are located in the same row in a data array that is processed as a unit (e.g., a read data stripe, a write data stripe).

As used herein, the term "catastrophic failure" refers to the failure of an entire solid state drive (SSD), such as a flash device. As used herein, the term "erasure correction" refers to correcting an error whose location is known. An erasure correction is different than an "error correction" which, as used herein, refers to correcting an error whose location is not known. Correcting erasures requires about half of the amount of redundancy that is required to correct errors. As used herein, the term "hard error" or "HE" refers to an erasure (i.e., an error with a known location).

While error correcting codes (ECCs), such as the Bose-Chaudhuri-Hocquenghem (BCH) code, help reduce a raw bit error rate in a flash device to a lower level after correction, the final level may still be higher than a target raw bit error rate for the storage system. For example, a fifteen bit correcting BCH code may bring down a raw bit error rate of 0.001 to a raw bit error rate of $2.7\ e^{-9}$ after decoding a 512 byte (B) sector. However, this raw bit error rate, which represents the probability of a HE in a flash device, is substantially higher than that of a typical hard disk drive (HDD), which may range from $8\ e^{-14}$ to $8\ e^{-16}$. Higher error rates are likely to occur near the end of write endurance as well as near the end of the data retention life in a flash device.

When the error correcting capability of an ECC is exceeded, this event will be detected with a very high probability. For example, if a fifteen bit correction BCH code has been implemented and more than fifteen errors have occurred, it is very likely that the BCH code itself will detect such an event. In any case, a cyclical redundancy code (CRC) is generally added in order to assure that the probability of miscorrection is of the order of 1 $e^{-26}$ or so. A BCH code failing to detect a miscorrection is symptomatically equivalent to an HDD dropped write or off-track write.

Any multiple erasure correcting code known in the art may be utilized by an embodiment. One example of a multiple erasure code utilized by an embodiment is a Reed-Solomon (RS) code. RS codes are well known in the art and can be used to correct a plurality of erasures. RS codes are based on symbols, with the size of the symbols depending on the application. For a tutorial on RS codes that is relevant to RAID architectures, see J. S. Plank "A Tutorial on Reed-Solomon Coding for Fault-Tolerance in RAID-like Systems", *Software, Practice & Experience*, 995-1012, September 1997.

Another family of efficient codes for correction of a plurality of erasures is given by the Blaum-Roth 93 (BR93) codes, as described in M. Blaum et al., New Array Codes for Multiple Phased Burst Correction", IEEE Transactions on Information Theory, vol. 39, pp. 66-77 1993. BR93 codes are array codes that tend to be less complex than RS codes by avoiding Galois field operations and doing only exclusive-or (XOR) operations instead.

Both the RS and BR93 codes are maximum distance separable (MDS) codes, meaning that they make optimal use of the redundancy in order to correct erasures. RS and BR93 codes are examples of two types of multiple erasure correcting codes that may be utilized by embodiments described herein. Embodiments are not limited to these two codes as other families of codes may also be implemented such as a generalized EVENODD code or a generalized row diagonal code (RDC).

Contrary to arrays of hard disk drives (HDDs), arrays of SSDs present a mixed failure mode. On one hand, there are catastrophic SSDs failures, as in the case of HDDs. On the other hand, there are hard errors (HEs), which in general are silent in that their existence is not known until an attempt is made to access a sector containing a HE. This situation complicates the task of recovery in a RAID (redundant arrays of independent disks) type of architecture. For example, assume that a catastrophic SSD failure occurs in a RAID 5 architecture. Recovery is started by reconstructing each sector of the failed device by "exclusive-oring" (XORing) the corresponding sectors in each of the surviving devices. However, if there is a row that has also suffered a HE, such a row has two sectors that have failed. RAID 5 cannot recover from such an event and data loss will occur.

A possible solution to the situation above is to use a RAID 6 type of architecture, in which two SSDs are used for parity. The RAID 6 architecture allows for the recovery of two erased sectors in a row. However, such a solution may be wasteful, since it requires an additional whole device to protect against HEs. Embodiments of the PMDS code described herein provide a solution that is intermediate between RAID 5 and RAID 6 by allowing the handling of HEs without the need of dedicating a whole second SSD to parity.

In order to handle this mixed environment of HEs with catastrophic failures, the way that information is written in SSDs is taken into account. The way that information is written in SSDs is quite different than the way that information is written in HDDs. In an SSD, a new write includes first erasing a number of consecutive sectors and then rewriting all of them. Therefore, the short write operation in arrays of SSDs (e.g., one sector at a time) is not an issue here: each time a new write is performed, a data stripe of, say, M sectors in each SSD is erased and then rewritten. In this case, the parity is recomputed as part of the new write. As described herein, it is assumed that a storage array is made up of "m×n" stripes (where "n" is the number of SSDs), repeated one after the other. Each m×n stripe is an independent unit and parity for each stripe will be computed in accordance with embodiments described herein. In addition, each new write includes writing a number of m×n stripes (this number may be one, depending on the application, the particular SSD used, and other factors). Embodiments of the family of PMDS codes described here allow for the simultaneous correction of catastrophic failures and HEs.

FIG. 1 illustrates a block diagram of a system 100 that is protected using PMDS codes in accordance with an embodiment. As shown in FIG. 1, a host computer 102 is in communication with an array controller 104 in a storage system 110. The storage system 110 stores data in a storage array 108 made up of n storage devices 106 (where n is greater than one): storage device zero 106a, storage device one 106b, storage device two 106c, through storage device n-1 106d. In an embodiment, parity bits are stored in the storage devices 106 along with host data (e.g., represented as data bits). In an embodiment, the storage devices 106 in the storage array 108 are implemented by SSDs such as flash devices. In an embodiment, the array is made up of five flash devices, each device having a 32 Gigabyte (GB) storage capacity. As shown in FIG. 1, the array controller 104 is part of the storage system 110; in another embodiment, the array controller 104 is part of the host computer 102.

Figure 2:
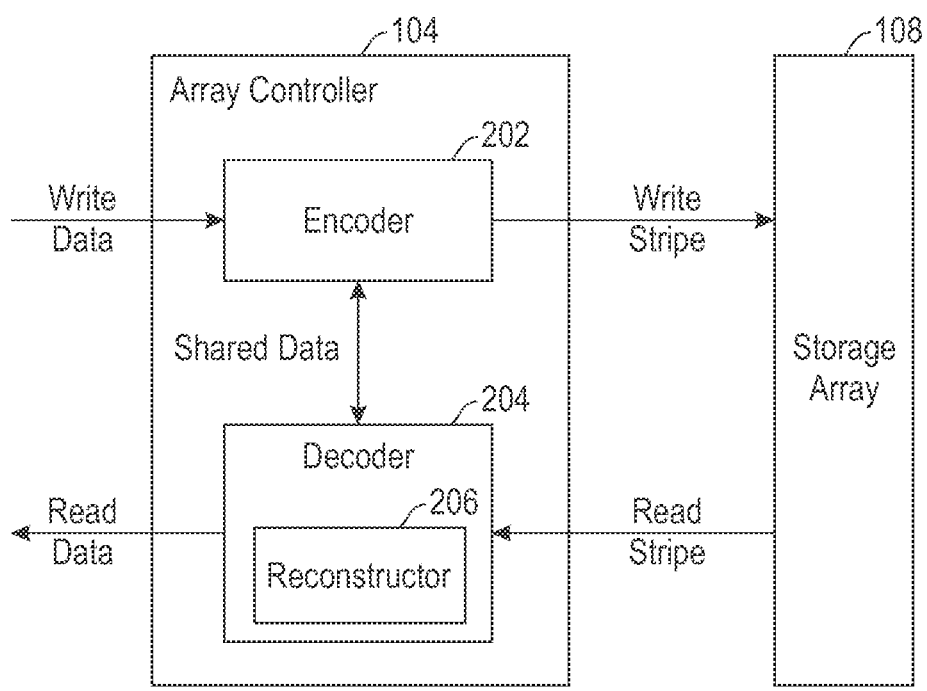
FIG. 2 illustrates a storage system in accordance with an embodiment.

FIG. 2 illustrates the storage system 110 of FIG. 1 in accordance with an embodiment. The storage system 110 may include numerous other elements such as receivers, transmitters, and clocks as known by those of ordinary skill in the art, which are not illustrated for purposes of clarity. As shown in FIG. 2, the array controller 104 includes an encoder 202 and a decoder 204. The encoder 202 is utilized during a write process for receiving one or more write data bits (e.g., from the host computer 102) and generating a write stripe, which includes both data entries and parity entries. Each entry includes "b" bits and may correspond to one or more pages, one or more sectors, and/or one or more symbols. In an embodiment, the write stripe is written in the storage array 108 and spans a plurality of rows in the storage array 108. The decoder 204 is utilized during a read process for reading one or more data entries from the storage array 108. When one or more HEs in an entry are detected, the decoder reads the whole stripe where the HE(s) has been detected from the storage array 108. The decoder 204 and the encoder 202 both have access to shared data (e.g., data to identify the type of encoding that was applied by the encoder 202 to the write entries to generate the write stripe). The read stripe contains parity bits that are removed by the decoder 204 to generate the read data. The decoder 204 includes a reconstructor 206 that is used when a read failure of at least one data entry has occurred. A read failure occurs, for example, when the error correcting capability of the internal ECC of an entry has been exceeded. Typically, the locations of the entries in error are known and thus, the error locations (e.g., the erased entry location(s)) and the read stripe are sent to the reconstructor 206, which attempts to retrieve the erased entries.

FIG. 3 depicts contents of a data array that is stored across a plurality of storage devices 106 (the data array is also referred to herein as a "stripe"). The data array is encoded as a unit by the encoder 202 using a PMDS code. As used herein, the term "encoding stripe" refers to a group of entries that together make up a write stripe and that are encoded with the PMDS code as a unit. As used herein, the term "decoding stripe" refers to a group of entries that together make up a read stripe and that are decoded with the PMDS as a unit.

The data array depicted in FIG. 3 includes entries arranged in m rows and n columns. The subscripts next to each entry type represent the position of the entry in the data array (e.g., "$a_{00}$" is an entry at row 0, column 0 in the data array). In an embodiment, each column represents a portion of a storage device. In the stripe depicted in FIG. 3, each entry represents "b" symbols stored in memory cells in a flash memory device. For the sake of description herein, it is assumed that each of the b symbols is a bit, but in practice it will likely be a much larger symbol. It is assumed that an ECC (e.g., BCH) and/or a CRC is used to detect that an entry read failure has occurred and to identify any erasure locations. Embodiments described herein assume that a read failure has been reported, regardless of the method used to identify such read failure.

In an embodiment, the decoder 204 receives a read stripe that has experienced HEs in one or more entries from the storage array 108 that has been encoded in the manner shown in FIG. 3. In an embodiment, recovery from the HEs is performed by the reconstructor 206 located in the decoder 204.

In accordance with an embodiment, each row in the array is protected by r parity entries in such a way that any r erasures in the row will be recovered. In other words, each row of the data array constitutes an [n, n−r, r+1] MDS code. In addition, "s" extra global parities are added to the array. The s extra parities may be placed in many different ways in the data array, but in order to simplify the description, in this example, they are placed in the last row. Being global means that these parities affect all "mn" entries in the data array. For example, instance in the 4x5 data array shown below, r=1 and s=2 and there are two extra global parities placed in the last row. "D" indicates data entries and "P" indicates parity entries.

| D | D | D | D | P |
|---|---|---|---|---|
| D | D | D | D | P |
| D | D | D | D | P |
| D | D | P | P | P |

Referring to the above data array, assume that a catastrophic failure occurs (that is, a whole column in the data array has failed), and in addition, there are up to two HEs anywhere in the data array. The PMDS described herein will correct these failures (also referred to herein as erasures). The situation is illustrated in the below data arrays. In the data array on the left, the two additional HEs occur in different rows. In the array on the right, the two additional HEs occur in the same row. "F" indicates failure and "N" indicates no failure.

| N | F | N | F | N | | N | N | N | F | N |
|---|---|---|---|---|---|---|---|---|---|---|
| N | N | N | F | N | | N | N | N | F | N |
| N | N | N | F | F | | F | N | N | F | F |
| N | N | N | F | N | | N | N | N | F | N |

One approach to solving this problem is using an MDS code. In the 4x5 data array example, there are a total of six parity entries. So, it is feasible to implement an MDS code on 20 entries (e.g., symbols) with six parity entries. So, we can implement a [20,14,7] MDS code (like a RS code). A problem with this approach is its complexity. In one embodiment this MDS code is a [20,14,7] RS code. This example, where the number of rows in a data array, m, is four is given for the purpose of illustration only. More typical values of m in applications are sixteen or thirty-two, and this would result in 18 or 34 parity entries. Implementing such a code, although feasible, is complex. It is desirable for the code base, in normal operation, to utilize its underlying RAID structure based on rows, like single parity in the case of RAID 5. The extra parities are invoked on relatively rare occasions. Embodiments of the PMDS codes described herein comply with the constraint of having a horizontal code in order to utilize the underlying RAID structures. In the case of the example of RAID 5 plus two global parities, a PMDS code can correct up to one erasure per row, and in addition, two erasures anywhere. Thus, the PMDS code can correct any of the situations depicted in the data arrays above that indicate failures and non-failures.

An Embodiment of the PMDS Code is Defined as Follows in Definition 1

Definition 1. Let $\mathcal{C}$ be a m×n data array such that each row is encoded into a [n, n −r, r+1] MDS code, and in addition s parity symbols are added into the array. $\mathcal{C}$ is an (r, s) PMDS code, if in addition to correcting up to r erasures per row, $\mathcal{C}$ can correct any s erasures anywhere in the array.

Code $\mathcal{C}$ as defined in Definition 1 is a two-dimensional code. It is assumed that the entries are read horizontally, in a row-wise manner, making the code an [mn, m(n−r)−s] linear code. Herein below actual constructions of codes are described based on their parity-check matrices, which are (mr+s)×mn matrices.

Figure 4:
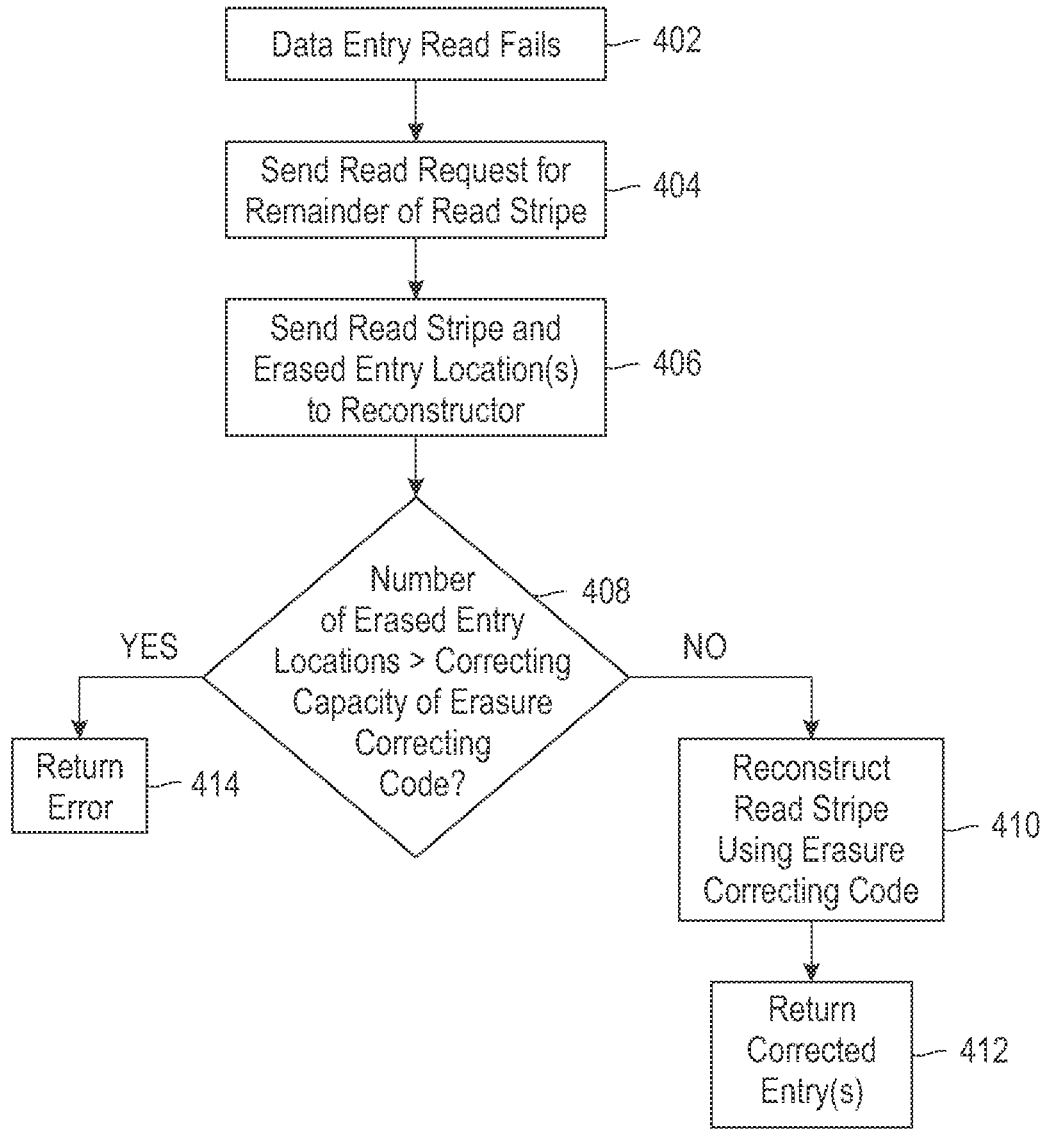
FIG. 4 is a process flow for performing erasure correction in accordance with an embodiment.

FIG. 4 depicts a process flow implemented by the decoder 204 in accordance with an embodiment. At block 402, the ECC and/or the CRC detect that a read of an entry has failed. At block 404, a request is sent to read all of the entries in the stripe that contains the entry where the read has failed. At block 406, the read stripe together with the location(s) of the entry(s) where the read has failed (i.e., the erased entry location(s)) are sent to the reconstructor 206. At block 408, it is determined if the number of erased entry locations in the read stripe is greater than the erasure correction capability of the scheme. For instance, if a code that can recover an erasure in each row plus two global parities has been implemented, and block 408 finds out that a whole column together with three extra entries have been erased, the erasure correction capability of the PMDS code is exceeded. If it is determined at block 408, that the number of erased entry locations in the read stripe is greater than the capability of the PMDS scheme, then block 414 is performed to return an error condition to the decoder 204. If it is determined at block 408, that the number of erased entry locations is within the capacity of the PMDS scheme, then block 410 is performed. At block 410, the read stripe is reconstructed using embodiments of the PMDS erasure correcting codes as described herein. At block 412, the reconstructor 206 outputs the recovered read stripe including the recovered read entry (s) to the decoder 204.

Figure 5:
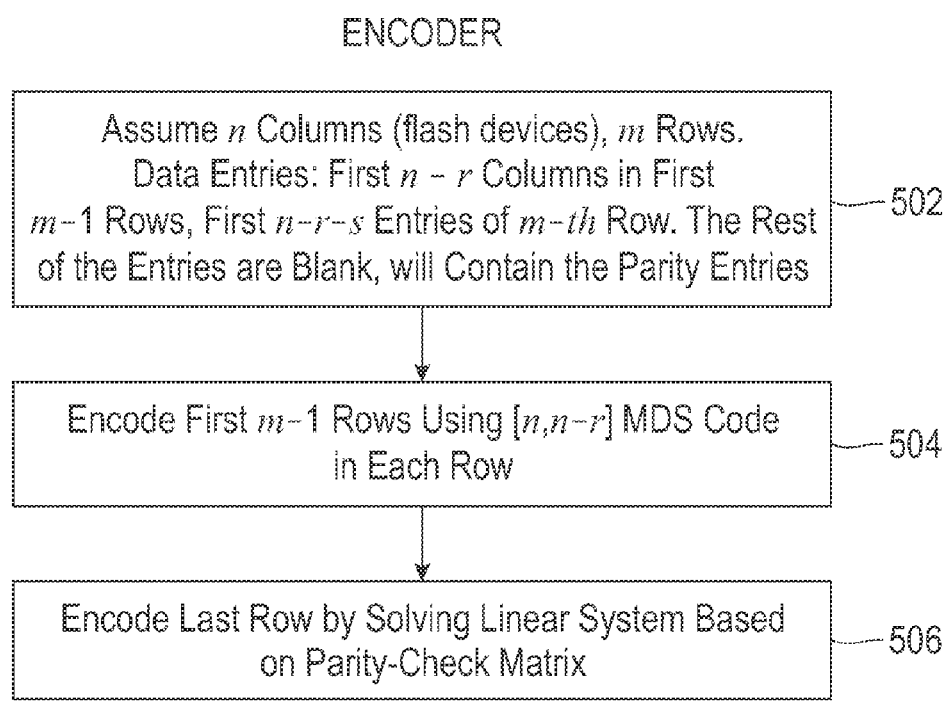
FIG. 5 is a process flow for encoding a write stripe in accordance with an embodiment.
Figure 6:
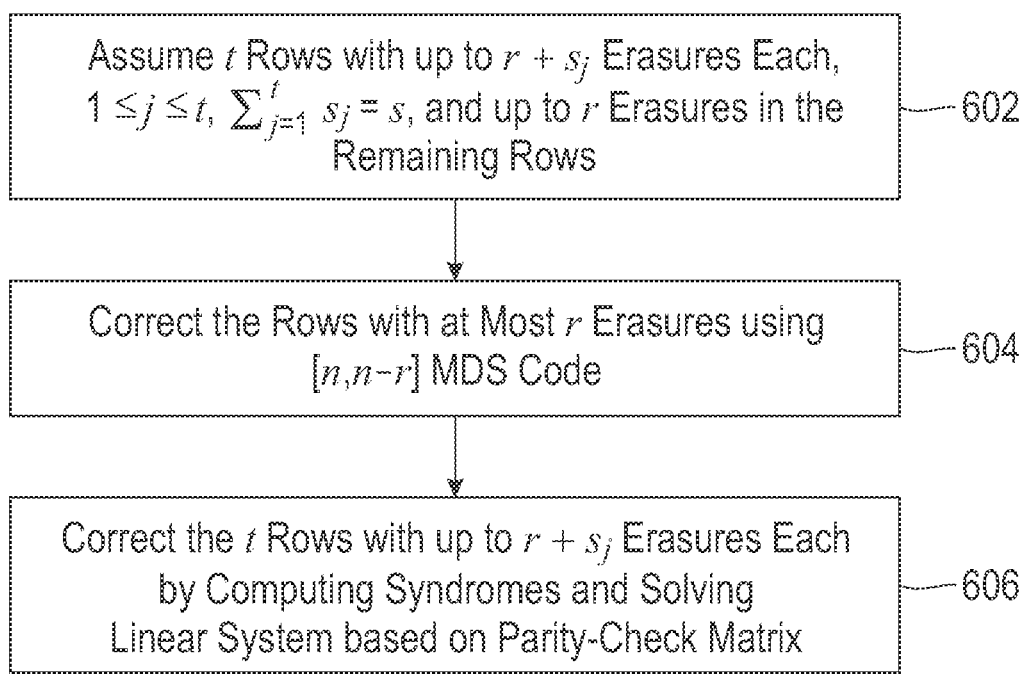
FIG. 6 is a process flow for decoding a read stripe in accordance with an embodiment.

FIGS. 5 and 6 describe an encoder and an erasure decoder following classic coding theory. In erasure decoding, the encoding is a special case of the decoding, and erasure solving involves syndrome calculation followed by solving a linear system with a number of equations equal to the number of erasures that have occurred. The syndromes are calculated from a parity-check matrix as given herein below, and the system always has a solution whenever the erasures are within the erasure-correcting capability of the code.

FIG. 5 is a process flow for encoding a write stripe in accordance with an embodiment. In an embodiment, the process flow depicted in FIG. 5 is performed by the encoder 202 to protect a m×n data array from r catastrophic errors and "s" additional errors. At block 502, it is assumed that there are "n" columns (e.g., flash devices) and m" rows. In addition, it is assumed that the entries in the first n—r columns in the first m−1 rows, and the first n−r−s entries of the mth row contain data entries (or information entries). The rest of the entries are blank and will be encoded using the PMDS code as described herein below. At block 504, the first m−1 rows are encoded using an [n, n−r] MDS code. In an embodiment, the results for each row are stored in the last n−r entries of the corresponding row. At block 506, the last row is encoded by solving a linear system based on a parity-check matrix as described herein below. In an embodiment, the results are stored in the last n−r−s entries in the last row, row m−1, of the data array.

FIG. 6 is a process flow for decoding a write stripe in accordance with an embodiment. In an embodiment, the process depicted in FIG. 6 is performed by the decoder 204 for an m×n data array. At block 602, it is assumed that there are "t" rows with up to $r+s_j$ erasures each (where $1 \le j \le t$), where the sum of the $s_j$s adds to s, and up to r erasures in the remaining rows. At block 604, the rows with at most r erasures are corrected using one or more [n, n−r] MDS codes. At block 606, the "t" rows with up to $r+s_j$ erasures each are corrected by computing syndromes and solving a linear system based on a parity-check matrix as described herein below.

Following is a description of code constructions for embodiments of the PMDS codes, as well as descriptions of general conditions for an erasure correcting code to be a PMDS code. In addition, specific embodiments of the PMDS code are described for selected applications.

Code Construction

As described above, each entry is made up of b bits. In an embodiment, it is assumed that each entry is in a ring. The ring is defined by a polynomial f(x) of degree b, i.e., the product of two elements in the ring (taken as polynomials of degree up to b−1), is the residue of dividing the product of both elements by f(x) (if f(x) is irreducible, the ring becomes the Galois field $GF(2^b)$). Let α be a root of the polynomial f(x) defining the ring. The exponent of f(x), denoted e (f(x)), is the exponent of α, i.e., the minimum l, $0 < l$, such that $\alpha^l = 1$. If f(x) is primitive, $e(f(x)) = 2^b - 1$.

A special case that will be important in applications is $f(x) = 1 + x + \ldots + x^{p-1}$, where p a prime number. In this case, $e(f(x)) = p$ and f(x) may not be irreducible. In fact, it is not difficult to prove that f(x) is irreducible if and only if 2 is primitive in GF(p). Thus, the polynomials of degree up to p−2 modulo $1+x+\ldots+x^{p-1}$ constitute a ring and not generally a field. This ring was used to construct the Blaum-Roth (BR) codes, and as described in embodiments herein, it is either assumed that f(x) is irreducible or that $f(x)=1+x+\ldots+x^{p-1}$, where p a prime number. A general construction is defined as follows.

Construction 1. Consider the binary polynomials modulo f(x), where either f(x) is irreducible or $f(x)=1+x+\ldots+x^{p-1}$, p a prime number. Let $mn \le e(f(x))$, where e(f(x)) denotes the exponent of f(x). Let $\mathcal{C}$ (m, n, r, s; f(x)) be the code whose (mr+s)×mn parity-check matrix is:

$$\mathcal{H}(m, n, r, s) = \begin{pmatrix} H(n, r, 0, 0) & \underline{0}(n, r) & \ldots & \underline{0}(n, r) \\ \underline{0}(n, r) & H(n, r, 0, r) & \ldots & \underline{0}(n, r) \\ \vdots & \vdots & \ddots & \vdots \\ \underline{0}(n, r) & \underline{0}(n, r) & \ldots & H(n, r, 0, (m-1)r) \\ H(mn, s, r, 0) & & & \end{pmatrix} \quad (1)$$

where H(n, r, i, j) is the r×n matrix $$H(n, r, i, j) = \begin{pmatrix} \alpha^{j2^i} & \alpha^{(j+1)2^i} & \alpha^{(j+2)2^i} & \ldots & \alpha^{(j+n-1)2^i} \\ \alpha^{j2^{i+1}} & \alpha^{(j+1)2^{i+1}} & \alpha^{(j+2)2^{i+1}} & \ldots & \alpha^{(j+n-1)2^{i+1}} \\ \alpha^{j2^{i+2}} & \alpha^{(j+1)2^{i+2}} & \alpha^{(j+2)2^{i+2}} & \ldots & \alpha^{(j+n-1)2^{i+2}} \\ \vdots & \vdots & \vdots & \ddots & \vdots \\ \alpha^{j2^{i+r-1}} & \alpha^{(j+1)2^{i+r-1}} & \alpha^{(j+2)2^{i+r-1}} & \ldots & \alpha^{(j+n-1)2^{i+r-1}} \end{pmatrix} \quad (2)$$

Matrices H(n, r, i, j) as given by equation (2), in which each row is the square of the previous one, have been used in the art for constructing codes for which the metric is given by the rank, for constructing codes that can be encoded on columns and decoded on rows, and for constructing differential MDS codes.

Example 1, which follows, illustrates Construction 1.

EXAMPLE 1

Consider m=3 and n=5, then, $$\mathcal{H}(3, 5, 1, 3) = \begin{pmatrix} 1 & 1 & 1 & 1 & 1 & 0 & 0 & 0 & 0 & 0 & 0 & 0 & 0 & 0 & 0 \\ 0 & 0 & 0 & 0 & 0 & 1 & 1 & 1 & 1 & 1 & 0 & 0 & 0 & 0 & 0 \\ 0 & 0 & 0 & 0 & 0 & 0 & 0 & 0 & 0 & 0 & 1 & 1 & 1 & 1 & 1 \\ 1 & \alpha & \alpha^2 & \alpha^3 & \alpha^4 & \alpha^5 & \alpha^6 & \alpha^7 & \alpha^8 & \alpha^9 & \alpha^{10} & \alpha^{11} & \alpha^{12} & \alpha^{13} & \alpha^{14} \\ 1 & \alpha^2 & \alpha^4 & \alpha^6 & \alpha^8 & \alpha^{10} & \alpha^{12} & \alpha^{14} & \alpha^{16} & \alpha^{18} & \alpha^{20} & \alpha^{22} & \alpha^{24} & \alpha^{26} & \alpha^{28} \\ 1 & \alpha^4 & \alpha^8 & \alpha^{12} & \alpha^{16} & \alpha^{20} & \alpha^{24} & \alpha^{28} & \alpha^{32} & \alpha^{36} & \alpha^{40} & \alpha^{44} & \alpha^{48} & \alpha^{52} & \alpha^{56} \end{pmatrix}$$

$$\mathcal{H}(3, 5, 2, 2) = \begin{pmatrix} 1 & 1 & 1 & 1 & 1 & 0 & 0 & 0 & 0 & 0 & 0 & 0 & 0 & 0 & 0 \\ 1 & \alpha & \alpha^2 & \alpha^3 & \alpha^4 & 0 & 0 & 0 & 0 & 0 & 0 & 0 & 0 & 0 & 0 \\ 0 & 0 & 0 & 0 & 0 & 1 & 1 & 1 & 1 & 1 & 0 & 0 & 0 & 0 & 0 \\ 0 & 0 & 0 & 0 & 0 & \alpha^5 & \alpha^6 & \alpha^7 & \alpha^8 & \alpha^9 & 0 & 0 & 0 & 0 & 0 \\ 0 & 0 & 0 & 0 & 0 & 0 & 0 & 0 & 0 & 0 & 1 & 1 & 1 & 1 & 1 \\ 0 & 0 & 0 & 0 & 0 & 0 & 0 & 0 & 0 & 0 & \alpha^{10} & \alpha^{11} & \alpha^{12} & \alpha^{13} & \alpha^{14} \\ 1 & \alpha^2 & \alpha^4 & \alpha^6 & \alpha^8 & \alpha^{10} & \alpha^{12} & \alpha^{14} & \alpha^{16} & \alpha^{18} & \alpha^{20} & \alpha^{22} & \alpha^{24} & \alpha^{26} & \alpha^{28} \\ 1 & \alpha^4 & \alpha^8 & \alpha^{12} & \alpha^{16} & \alpha^{20} & \alpha^{24} & \alpha^{28} & \alpha^{32} & \alpha^{36} & \alpha^{40} & \alpha^{44} & \alpha^{48} & \alpha^{52} & \alpha^{56} \end{pmatrix}$$

Construction 1 provides PMDS codes for particular parameters and polynomial functions (i.e., f(x)) defining the ring or field. The received entries are denoted by $(a_{i,j})_{0 \leq i \leq m-1, 0 \leq j \leq n-1}$ with the erased entries being equal to 0. The first step is computing the rm+s syndromes. For a $\mathcal{C}$ (m, n, r, s; f(x)) code, using the parity-check matrix $\mathcal{H}$ (m, n, r, s; f(x)) given by (1), the syndromes are:

$$S_{ir} = \bigoplus_{j=0}^{n-1} a_{i,j} \text{ for } 0 \leq i \leq m-1 \tag{3}$$

$$S_{ir+l+1} = \bigoplus_{j=0}^{n-1} \alpha^{(ni+j)2^l} a_{i,j} \text{ for } 0 \leq i \leq m-1, 0 \leq l \leq r-2 \tag{4}$$

$$S_{mr+u} = \bigoplus_{i=0}^{m-1}\bigoplus_{j=0}^{n-1} \alpha^{(ni+j)(2^{r+u}-1)} a_{i,j} \text{ for } 0 \leq u \leq s-1 \tag{5}$$

The case r=1. Following is a description of the case where r=1 and a description of how to use the syndromes for decoding and determining whether $\mathcal{C}$ (m, n, 1, s; f(x)) codes are PMDS. The parity-check matrix $\mathcal{H}$ (m, n, 1, s) given by formula (1) is written as:

$\mathcal{H}$ (m, n, 1, s) = $\mathcal{H}_0$(m, n, 1, s), $\mathcal{H}_1$(m, n, 1, s), . . . ,
$\mathcal{H}_{m-1}$(m, n, 1, s)), where, for $0 \leq j \leq m-1$ $$\mathcal{H}_j(m, n, 1, s) = \begin{pmatrix} 0 & 0 & \cdots & 0 \\ 0 & 0 & \cdots & 0 \\ \vdots & \vdots & \ddots & \vdots \\ 0 & 0 & \cdots & 0 \\ j \to 1 & 1 & \cdots & 1 \\ 0 & 0 & \cdots & 0 \\ \vdots & \vdots & \ddots & \vdots \\ 0 & 0 & \cdots & 0 \\ \alpha^{jn} & \alpha^{jn+1} & \cdots & \alpha^{(j+1)n-1} \\ \alpha^{2jn} & \alpha^{2(jn+1)} & \cdots & \alpha^{2((j+1)n-1)} \\ \alpha^{4jn} & \alpha^{4(jn+1)} & \cdots & \alpha^{4((j+1)n-1)} \\ \vdots & \vdots & \ddots & \vdots \\ \alpha^{2^{s-1}jn} & \alpha^{2^{s-1}(jn+1)} & \cdots & \alpha^{2^{s-1}((j+1)n-1)} \end{pmatrix}\Bigg\} m$$

It is assumed that $\sum_{j=1}^{t} s_j = s$ for integers $s_j \geq 0$. The code $\mathcal{C}$ (m, n, 1, s; f(x)) is $(s_1+1, s_2+1, \ldots, s_t+1)$-erasure correcting if each time there are at most $s_j+1$ erasures in a row $i_j$, where $0 \leq i_1 < i_2 < \ldots < i_t \leq m-1$, the code $\mathcal{C}$ (m, n, 1, s; f(x)) can correct such erasures. Notice that, according to Definition 1, code $\mathcal{C}$ (m, n, 1, s; f(x)) is PMDS if and only if $\mathcal{C}$ (m, n, 1, s; f(x)) is $(s_1+1, s_2+1, \ldots, s_t+1)$-erasure correcting for each choice of integers $s_j \geq 1$ such that $\sum_{j=1}^{t} s_j = s$. The following lemmas define when to characterize $\mathcal{C}$ (m, n, 1, s; f(x)) as $(s_1+1, s_2+1, \ldots, s_t+1)$-erasure correcting.

Lemma 1. Consider a code $\mathcal{C}$ (m, n, 1, s; f(x)) and let $s_j \geq 1$ for $1 \leq j \leq t$ such that $\sum_{j=1}^{t} s_j = s$. For each $s_j$ if $s_j$ is odd, let $s'_j = s_j$, while if $s_j$ is even, let $s'_j = s_j - 1$ and $s' = \sum_{j=t} s'_j$. Then, $\mathcal{C}$ (m, n, 1, s; f(x)) is $(s_1+1, s_2+1, \ldots, s_t+1)$-erasure correcting if and only if $\mathcal{C}$ (m, n, 1, s'; f(x)) is $(s'_1+1, s'_2+1, \ldots, s'_t+1)$-erasure correcting.

Lemma 2. Consider a code $\mathcal{C}$ (m, n, 1, s; f(x)) and let $s_j \geq 1$, each $s_j$ an odd number for $1 \leq j \leq t$ such that $\sum_{j=1}^{t} s_j = s$. Then, $\mathcal{C}$ (m, n, 1, s; f(x)) is $(s_1+1, s_2+1, \ldots, s_t+1)$-erasure correcting if and only if, for any $0 \leq i_2 < i_3 < \ldots < i_t \leq m-1$, $0 \leq l_{j,0} < l_{j,1} < \ldots < l_{j,s_j} \leq n-1$ for $1 \leq j \leq t$, $$gcd\left(1 + \sum_{u=1}^{s_1} x^{l_{1,u}-l_{1,0}} + \sum_{j=2}^{t} x^{i_j n + l_{j,0} - l_{1,0}}\left(1 + \sum_{u=1}^{s_j} x^{l_{j,u} - l_{j,0}}\right), f(x)\right) = 1 \tag{6}$$

The combination of Lemmas 1 and 2 results in the following theorem. Theorem 1. For $s \geq 1$, code $\mathcal{C}$ (m, n, 1, s; f(x)) as given by Construction 1 is PMDS if and only if: (1) code $\mathcal{C}$ (m, n, 1, s-1; f(x)) is PMDS, and (2) for any $(s_1, s_2, \ldots, s_t)$ such that $\sum_{j=1}^{t} s_j = s$ and each $s_j$ is odd, for any $0 \leq i_2 < i_3 < \ldots < i_t \leq m-1$, and for any $1 \leq j \leq t$ and $0 \leq l_{j,0} < l_{j,1} < \ldots < l_{j,s_j} \leq n-1$, (6) holds.

Theorem 1 provides conditions to check in order to determine if a code $\mathcal{C}$ (m, n, 1, s; f(x)) as given by Construction 1 is PMDS, but by itself it does not provide any family of PMDS codes. Consider the ring of polynomials modulo f(x)= $1+x+ \ldots +x^{p-1}$, such that p is prime and mn<p. There are cases in which f(x) is irreducible and the ring becomes a field (equivalently, 2 is primitive in GF(p)). Notice that the polynomials in Theorem 1 have degree at most mn-1<p-1=deg (f(x)). Therefore, if f(x) is irreducible, then all such polynomials are relatively prime with f(x) and the code is PMDS. This is stated below as Theorem 2, which provides a family of PMDS codes (it is not known if the number of irreducible polynomials f(x)=$1+x+ \ldots +x^{p-1}$ is infinite or not).

Theorem 2. Consider the code $\mathcal{C}$ (m, n, 1, s; f(x)) given by Construction 1 over the field of elements modulo f(x)= $1+x+ \ldots +x^{p-1}$ such that p is a prime number and f(x) is irreducible (or equivalently, 2 is primitive in GF(p)). Then, code $\mathcal{C}$ (m, n, 1, s; f(x)) is PMDS.

So far descriptions have dealt with general values of s. In the following text special cases that may be important for applications are described.

Case where r=1 and s=1: $\mathcal{C}$ (m, n, 1,1; f(x))

$\mathcal{C}$ (m, n, 1,1; f(x)) is always PMDS, since by Theorem 1, the binomials of type $1+x^j$ for $1 \leq j \leq n-1$ and f(x) are relatively prime. This is certainly the case when f(x) is irreducible, and in the case f(x)=$1+x+ \ldots +x^{p-1}$ such that p is a prime number and f(x) is reducible it is also true. This result is stated as Theorem 3.

Theorem 3. Code $\mathcal{C}$ (m, n, 1,1; f(x)) is always PMDS.

Case where r=1 and s=2: $\mathcal{C}$ (m, n, 1,2; f(x))

This case is important in applications, in particular, for arrays of SSDs. Since $\mathcal{C}$ (m, n, 1,1; f(x)) is PMDS, Theorem 1 gives the following theorem for the case where s=2.

Theorem 4. Code $\mathcal{C}$ (m, n, 1,2; f(x)) is PMDS if and only if, for any $1 \leq i \leq m-1$, and for any $0 \leq l_{1,0} < l_{1,1} \leq n-1$, $0 \leq l_{2,0} < l_{2,1} \leq n-1$, $$gcd(1+x^{l_{1,1}-l_{1,0}}+x^{in+l_{2,0}-l_{1,0}}(1+x^{l_{2,1}-l_{2,0}}), f(x))=1. \tag{7}$$

Since this case is important in applications, the decoding (of which the encoding is a special case) is described herein in some detail, the other cases being treated similarly.

Consider a PMDS code $\mathcal{C}$ (m, n, 1,2; f(x)), i.e., it satisfies the conditions of Theorem 4. Without loss of generality, assume that there are either three erasures in the same row $i_0$, or two pairs of erasures in different rows $i_0$ and $i_1$, where $0 \leq i_0 < i_1 \leq m-1$. Consider the first the case in which the three erasures occur in the same row $i_0$ and in entries $j_0, j_1$ and $j_2$ of row $i_0$, $0 \leq j_0 < j_1 < j_2$. Assuming initially that $a_{i_0,j_0} = a_{i_0,j_1} = a_{i_0,j_2} = 0$, using equations (3) and (5) (equation (4) is used only for r>1), the syndromes $S_{i_0}$, $S_m$ and $S_{m+1}$ are computed.

Using the parity-check matrix $\mathcal{H}(m, n, 1, 2)$ as given by equation (1), the following linear system is solved:

$$a_{i_0,j_0} \oplus a_{i_0,j_1} \oplus a_{i_0,j_2} = S_{i_0}$$

$$\alpha^{i_0 n + j_0} a_{i_0,j_0} \oplus \alpha^{i_0 n + j_1} a_{i_0,j_1} \oplus \alpha^{i_0 n + j_2} a_{i_0,j_2} = S_m$$

$$\alpha^{2(i_0 n + j_0)} a_{i_0,j_0} \oplus \alpha^{2(i_0 n + j_1)} a_{i_0,j_1} \oplus \alpha^{2(i_0 n + j_2)} a_{i_0,j_2} = S_{m+1}$$

The solution to this system is:

$$a_{i_0,j_0} = \frac{\det\begin{pmatrix} S_{i_0} & 1 & 1 \\ S_m & \alpha^{i_0 n + j_1} & \alpha^{i_0 n + j_2} \\ S_{m+1} & \alpha^{2(i_0 n + j_1)} & \alpha^{2(i_0 n + j_2)} \end{pmatrix}}{\det\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix}}$$

$$a_{i_0,j_1} = \frac{\det\begin{pmatrix} 1 & S_{i_0} & 1 \\ \alpha^{i_0 n + j_0} & S_m & \alpha^{i_0 n + j_2} \\ \alpha^{2(i_0 n + j_0)} & S_{m+1} & \alpha^{2(i_0 n + j_2)} \end{pmatrix}}{\det\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix}}$$

$$a_{i_0,j_2} = \frac{\det\begin{pmatrix} 1 & 1 & S_{i_0} \\ \alpha^{i_0 n + j_0} & \alpha^{i_0 n + j_1} & S_m \\ \alpha^{2(i_0 n + j_0)} & \alpha^{2(i_0 n + j_1)} & S_{m+1} \end{pmatrix}}{\det\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix}}$$

Since matrix:

$$\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix}$$

is a Vandermonde matrix, $$\det\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix} = \alpha^{4 i_0 n + 3 j_0 + j_1}(1 \oplus \alpha^{j_1 - j_0})(1 \oplus \alpha^{j_2 - j_0})(1 \oplus \alpha^{j_2 - j_1}).$$

the ring of polynomials modulo $$1 + x + th, a_{i_0,j_2} = \frac{\det\begin{pmatrix} 1 & 1 & S_{i_0} \\ \alpha^{i_0 n + j_0} & \alpha^{i_0 n + j_1} & S_m \\ \alpha^{2(i_0 n + j_0)} & \alpha^{2(i_0 n + j_1)} & S_{m+1} \end{pmatrix}}{\det\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix}}$$

Since matrix $$\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix}$$

is a Vandermonde matrix, $$\det\begin{pmatrix} 1 & 1 & 1 \\ \alpha^{i_0 n + j_0} & \alpha^{i_0 n + j_1} & \alpha^{i_0 n + j_2} \\ \alpha^{2(i_0 n + j_0)} & \alpha^{2(i_0 n + j_1)} & \alpha^{2(i_0 n + j_2)} \end{pmatrix} = \alpha^{4 i_0 n + 3 j_0 + j_1}(1 \oplus \alpha^{j_1 - j_0})(1 \oplus \alpha^{j_2 - j_0})(1 \oplus \alpha^{j_2 - j_1})$$

As will be appreciated by those skilled in the art, the elements $1 \oplus \alpha^{j_1 - j_0}$, $1 \oplus \alpha j^{1 - j_0}$ and $1 \oplus \alpha^{j_2 - j_1}$ can be efficiently inverted in the ring of polynomials modulo $1 + x + \ldots + x^{p-1}$, p a prime, for instance, using the method described in Blaum and Roth, "Method and Means for Coding and Rebuilding the Data Contents of Unavailable DASDs or Rebuilding the Contents of a DASD in Error in the Presence of a Reduced Number of Unavailable DASDs in a DASD Array", U.S. Pat. No. 5,321,246.

The encoding is a special case of the decoding. For instance, assume that the two global parities are placed in locations (m−1, n−3) and (m−1, n−2) in the array shown in FIG. 3. After computing the parities $a_{i,n-1}$ for $0 \leq i \leq m-2$ using single parity, the parities $a_{m-1,n-3}$, $a_{m-1,n-2}$ and $a_{m-1,n-1}$ are computed using the method above. In particular, the Vandermonde determinant becomes (making $i_0 = m-1$, $j_0 = n-3$, $j_1 = n-2$ and $j_2 = n-1$) $\alpha^{4(m+n)-15}(1 \oplus \alpha)(1 \oplus \alpha^2)(1 \oplus \alpha) = \alpha^{4(m+n)-15}(1 \oplus \alpha^4)$. So, only $1 \oplus \alpha^4$ has to be inverted for the encoding, and many operations may be pre-calculated, making the encoding very efficient.

Another case is when there are two pairs of erasures in rows $i_0$ and $i_1$, $0 \leq i_0 < i_1 \leq m-1$. In this example, it is assumed that the erased entries are $a_{i_0,j_0}$ and $a_{i_0,j_1}$ in row $i_0$, $0 \leq j_0 < j_1 \leq n-1$, and $a_{i_1,l_0}$ and $a_{i_1,l_1}$ in row $i_1$, $0 \leq l_0 < l_1 \leq n-1$. Again, using the parity-check matrix $\mathcal{H}(m, n, 1, 2)$, the linear system of 4 equations with 4 unknowns is solved.

$$a_{i_0,j_0} \oplus a_{i_0,j_1} = S_{i_0}$$

$$a_{i_1,l_0} \oplus a_{i_1,l_1} = S_{i_1}$$

$$\alpha^{i_0 n + j_0} a_{i_0,j_0} \oplus \alpha^{i_0 n + j_1} a_{i_0,j_1} \oplus \alpha^{i_1 n + l_0} a_{i_1,l_0} \oplus \alpha^{i_1 n + l_1} a_{i_1,l_1} = S_m$$

$$\alpha^{2(i_0 n + j_0)} a_{i_0,j_0} \oplus \alpha^{2(i_0 n + j_1)} a_{i_0,j_1} \oplus \alpha^{2(i_1 n + l_0)} a_{i_1,l_0} \oplus \alpha^{2(i_1 n + l_1)} a_{i_1,l_1} = S_{m+1}$$

where $S_{i_0}$ and $S_{i_1}$ are given by (3) and $S_m$ and $S_{m+1}$ are given by equation (5). In order to solve this linear system, the below determinant is inverted.

$$\det\begin{pmatrix} 1 & 1 & 0 & 0 \\ 0 & 0 & 1 & 1 \\ \alpha^{i_0 n + j_0} & \alpha^{i_0 n + j_1} & \alpha^{i_1 n + l_0} & \alpha^{i_1 n + l_1} \\ \alpha^{2(i_0 n + j_0)} & \alpha^{2(i_0 n + j_1)} & \alpha^{2(i_1 n + l_0)} & \alpha^{2(i_1 n + l_1)} \end{pmatrix}.$$

By row operations, it is seen that this determinant is equal to the following determinant times a power of $\alpha$:

$$\det\begin{pmatrix} 1 & 1 & 0 & 0 \\ 0 & 0 & 1 & 1 \\ 0 & 1\oplus\alpha^{j_1-j_0} & 0 & \alpha^{(i_1-i_0)n+\ell_0-j_0}(1\oplus\alpha^{\ell_1-\ell_0}) \\ 0 & 1\oplus\alpha^{2(j_1-j_0)} & 0 & \alpha^{2((i_1-i_0)n+\ell_0-j_0)}(1\oplus\alpha^{2(\ell_1-\ell_0)}) \end{pmatrix} =$$

$$\det\begin{pmatrix} 1\oplus\alpha^{j_1-j_0} & \alpha^{(i_1-i_0)n+\ell_0-j_0}(1\oplus\alpha^{\ell_1-\ell_0}) \\ 1\oplus\alpha^{2(j_1-j_0)} & \alpha^{2((i_1-i_0)n+\ell_0-j_0)}(1\oplus\alpha^{2(\ell_1-\ell_0)}) \end{pmatrix}$$

It is noted that this determinant corresponds to a 2×2 Vandermonde matrix, and it equals $1\oplus\alpha^{j_1-j_0}\oplus\alpha^{(i_1i_0)n+\ell_0}(1\oplus\alpha^{\ell_1-\ell_0})$ times $\alpha^{(i_1-i_0)n+\ell_0-j_0}(1\oplus\alpha^{j_1-j_0})(1\oplus\alpha^{\ell_1-\ell_0})$. As described previously, this last expression is easy to invert in the case of a ring modulo $f(x)=1+x+\ldots+x^{p-1}$, $p$ a prime number. Inverting $1\oplus\alpha^{j_1-j_0}\oplus\alpha^{(i_1-i_0)n+\ell_0}(1\oplus\alpha^{\ell_1-\ell_0})$, however, is not as neat as inverting binomials $1\oplus\alpha^j$, as shown above. Since $1+x^{j_1-j_0}+x^{(i_1-i_0)n+\ell_0-j_0}(1+x^{\ell_1\ell_0})$ and $1+x+\ldots+x^{p-1}$ are relatively prime by Theorem 4, $1+x^{j_1-j_0}+x^{(i_1-i_0)n+\ell_0-\ell_0}(1+x^{\ell_1-\ell_0})$ modulo $f(x)$ is inverted using Euclid's algorithm. This takes some computational time, but it is not an operation done very often. When it is invoked performance has already been degraded due in general to a catastrophic failure.

Following is an analysis of some concrete PMDS codes $\mathcal{C}(m,n,1,2;f(x))$. Consider first finite fields $GF(2^b)$. Table 1, below, includes the value b, the irreducible polynomial $f(x)$ (in octal notation), the exponent $e(f(x))$, and values m and n for which the code $\mathcal{C}(m,n,1,2;f(x))$ is PMDS according to Theorem 4. This list is not intended to be exhaustive of all possible values where the code is PMDS.

TABLE 1

| b | f(x) | e(f(x)) | m | m | b | f(x) | e(f(x)) | m | n |
|---|---|---|---|---|---|---|---|---|---|
| 8 | 4 3 5 | 255 | 5 | 5 | 16 | 2 2 7 2 1 5 | 13107 | 404 | 6 |
|   | 5 6 7 | 85 | 7 | 5 |   |   |   | 346 | 7 |
|   | 4 3 3 | 51 | 10 | 5 |   |   |   | 303 | 8 |
| 9 | 1 0 2 1 | 511 | 20 | 6 |   |   |   | 269 | 9 |
|   | 1 2 3 1 | 73 | 10 | 7 |   |   |   | 242 | 10 |
| 10 | 3 0 2 5 | 1023 | 21 | 6 |   |   |   | 164 | 11 |
|   |   |   | 15 | 7 |   |   |   | 160 | 12 |
| 11 | 6 0 1 5 | 2047 | 29 | 6 |   |   |   | 59 | 16 |
|   | 5 3 6 1 | 2047 | 25 | 7 |   |   |   | 45 | 17 |
|   |   |   | 22 | 8 |   |   |   | 53 | 18 |
|   |   |   | 13 | 10 |   |   |   | 24 | 20 |
| 12 | 1 5 6 4 7 | 4095 | 67 | 6 |   |   |   | 19 | 22 |
|   |   |   | 58 | 7 |   |   |   | 21 | 23 |
|   |   |   | 50 | 8 |   |   |   | 18 | 24 |
|   |   |   | 24 | 9 |   |   |   | 17 | 25 |
|   |   |   | 22 | 10 |   |   |   | 16 | 26 |

Next, consider the ring of polynomials modulo $f(x)=1+x+\ldots+x^{p-1}$, $p$ a prime and $mn<e(f(x))=p$. Theorem 2 solves the case in which $f(x)$ is irreducible, so in this case it is assumed that $f(x)$ is not irreducible, i.e., the ring is not a field. This ring was considered for the BR codes because it allows for efficient correction of erasures for symbols of large size without using look-up tables like in the case of finite fields. All possible cases of Theorem 4 need to be checked for different values of m and n, $mn<p$.

The results are tabulated in Table 2, below, which gives the list of primes between 17 and 257 for which $f(x)$ is reducible (hence, 2 is not primitive in $GF(p)$), together with some values of m and n, and a statement indicating whether the code is PMDS or not. For most such primes the codes are PMDS. The only exceptions are 31, 73 and 89. The case of 89 is particularly interesting, since for m=8 and n=11 as well as for m=n=9, the codes are not PMDS. However, for m=11 and n=8, the code is PMDS, which illustrates the fact that a code being PMDS does not depend only on the polynomial $f(x)$ chosen, but also on m and n.

TABLE 2

| Prime | m | n | C(m, n, 1, 2; f(x)) PMDS? |
|---|---|---|---|
| 17 | 4 | 4 | YES |
| 23 | 3 | 7 | YES |
|   | 4 | 5 | YES |
| 31 | 5 | 6 | NO |
|   | 6 | 5 | NO |
| 41 | 5 | 8 | YES |
|   | 6 | 6 | YES |
|   | 8 | 5 | YES |
| 43 | 5 | 8 | YES |
|   | 6 | 7 | YES |
| 47 | 4 | 11 | YES |
|   | 5 | 9 | YES |
| 71 | 7 | 10 | YES |
|   | 8 | 8 | YES |
|   | 10 | 7 | YES |
| 73 | 6 | 12 | NO |
|   | 7 | 10 | NO |
|   | 8 | 9 | NO |
|   | 9 | 8 | NO |
| 79 | 6 | 13 | YES |
|   | 7 | 11 | YES |
|   | 8 | 9 | YES |
| 89 | 8 | 11 | NO |
|   | 9 | 9 | NO |
|   | 11 | 8 | YES |
| 97 | 8 | 12 | YES |
|   | 10 | 9 | YES |
|   | 12 | 8 | YES |
| 103 | 9 | 11 | YES |
|   | 10 | 10 | YES |
|   | 11 | 9 | YES |
| 109 | 9 | 12 | YES |
|   | 10 | 10 | YES |
|   | 12 | 9 | YES |
| 113 | 10 | 11 | YES |
|   | 11 | 10 | YES |
|   | 12 | 9 | YES |
| 127 | 11 | 11 | YES |
|   | 13 | 9 | YES |
| 137 | 11 | 12 | YES |
|   | 12 | 11 | YES |
|   | 13 | 10 | YES |
|   | 15 | 9 | YES |
|   | 16 | 8 | YES |
| 151 | 15 | 10 | YES |
|   | 16 | 9 | YES |
| 157 | 12 | 13 | YES |
|   | 13 | 12 | YES |
|   | 14 | 11 | YES |
|   | 15 | 10 | YES |
|   | 16 | 9 | YES |
| 167 | 12 | 13 | YES |
|   | 13 | 12 | YES |
|   | 15 | 11 | YES |
|   | 16 | 10 | YES |
| 191 | 13 | 14 | YES |
|   | 14 | 13 | YES |
|   | 17 | 11 | YES |
| 193 | 16 | 12 | YES |
| 199 | 14 | 14 | YES |
|   | 16 | 12 | YES |
| 223 | 15 | 14 | YES |
|   | 17 | 13 | YES |
| 229 | 15 | 15 | YES |
|   | 16 | 14 | YES |
| 233 | 15 | 15 | YES |
|   | 16 | 14 | YES |
| 239 | 15 | 15 | YES |
|   | 16 | 14 | YES |

TABLE 2-continued

| Prime | m | n | C(m, n, 1, 2; f(x)) PMDS? |
|---|---|---|---|
| 241 | 16 | 15 | YES |
| 251 | 16 | 15 | YES |
|  | 25 | 10 | YES |
| 257 | 16 | 16 | YES |
|  | 32 | 8 | YES |

Case where r=1 and s=3: $\mathcal{C}$ (m, n, 1,3; f(x))

There are two ways to obtain s=3 as a sum of odd numbers: one is 3 itself, the other is 1+1+1. Then, based on Theorem 1, Theorem 5 is:

Theorem 5. Code $\mathcal{C}$ (m, n, 1,3; f(x)) is PMDS if and only if code $\mathcal{C}$ (m, n, 1,2; f(x)) is PMDS, and, for $1 \leq l_1 < l_2 < l_3 \leq n-1$, $$gcd(1+x^{l_1}+x^{l_2}+x^{l_3}, f(x))=1 \qquad (8)$$

and, for any $1 \leq i_2 < i_3 \leq m-1$, $0 \leq l_{1,0} < l_{1,1} \leq n-1$, $0 \leq l_{2,0} < l_{2,1} \leq n-1$ and $0 \leq l_{3,0} < l_{3,1} \leq n-1$, $$gcd(1+x^{l_{1,1}-l_{1,0}}+x^{i_2n+l_{2,0}-l_{1,0}}(1+x^{l_{2,1}-l_{2,0}})+ \\ x^{i_3n+l_{3,0}-l_{1,0}}(1+x^{l_{3,1}-l_{3,0}}), f(x))=1 \qquad (9)$$

So, to check if code $\mathcal{C}$ (m, n, 1, 3; f(x)) is PMDS, a first check is made to determine whether $\mathcal{C}$ (m, n, 1,2; f(x)) is PMDS, similar to the cases tabulated in Tables 1 and 2 above. Then a check is made to see if equations (8) and (9) of Theorem 5 are satisfied.

For instance, the codes in Table 1 are $\mathcal{C}$ (m, n, 1,2; f(x)) PMDS codes, but equation (9) in Theorem 5 is quite restrictive and most of the entries do not correspond to $\mathcal{C}$ (m, n, 1,3; f(x)) PMDS codes. In Table 2, however, several of the codes that are $\mathcal{C}$ (m, n, 1,2; f(x)) PMDS codes are also $\mathcal{C}$ (m, n, 1,3; f(x)) PMDS codes. These results are shown in Table 3, below, which shows that for the primes 17, 43, 89, 127, 151, 241 and 257, and also for 89 with (m, n)=(11,8), the codes are not $\mathcal{C}$ (m, n, 1,3; f(x)) PMDS codes, although they were $\mathcal{C}$ (m, n, 1,2; f(x)) PMDS codes. Table 3 shows values of p such that 2 is not primitive in GF(p), and some codes $\mathcal{C}$ (m, n, 1,3; f(x)), mn<p.

TABLE 3

| Prime | m | n | C(m, n, 1, 3; f(x)) PMDS? | Prime | m | n | C(m, n, 1, 2; f(x)) PMDS? |
|---|---|---|---|---|---|---|---|
| 17 | 4 | 4 | NO | 109 | 9 | 12 | YES |
| 23 | 3 | 7 | YES |  | 10 | 10 | YES |
|  | 4 | 5 | YES |  | 12 | 9 | YES |
| 31 | 5 | 6 | NO | 113 | 10 | 11 | YES |
|  | 6 | 5 | NO |  | 11 | 10 | YES |
| 41 | 5 | 8 | YES |  | 12 | 9 | YES |
|  | 6 | 6 | YES | 127 | 11 | 11 | NO |
|  | 8 | 5 | YES |  | 13 | 9 | NO |
| 43 | 5 | 8 | NO | 137 | 11 | 12 | YES |
|  | 6 | 7 | NO |  | 12 | 11 | YES |
| 47 | 4 | 11 | YES | 151 | 15 | 10 | NO |
|  | 5 | 9 | YES |  | 16 | 9 | NO |
| 71 | 7 | 10 | YES | 157 | 15 | 10 | YES |
|  | 8 | 8 | YES |  | 16 | 9 | YES |
|  | 10 | 7 | YES | 167 | 16 | 10 | YES |
| 73 | 6 | 12 | NO | 191 | 17 | 11 | YES |
|  | 7 | 10 | NO | 193 | 16 | 12 | YES |
|  | 8 | 9 | NO | 199 | 16 | 12 | YES |
|  | 9 | 8 | NO | 223 | 17 | 13 | YES |
| 79 | 6 | 13 | YES | 229 | 16 | 14 | YES |
|  | 7 | 11 | YES |  | 28 | 8 | YES |
|  | 8 | 9 | YES | 233 | 23 | 10 | YES |

TABLE 3-continued

| Prime | m | n | C(m, n, 1, 3; f(x)) PMDS? | Prime | m | n | C(m, n, 1, 2; f(x)) PMDS? |
|---|---|---|---|---|---|---|---|
| 89 | 8 | 11 | NO | 239 | 26 | 9 | YES |
|  | 9 | 9 | NO | 241 | 16 | 15 | NO |
|  | 11 | 8 | NO |  | 24 | 10 | NO |
| 97 | 8 | 12 | YES | 251 | 25 | 10 | YES |
|  | 10 | 9 | YES | 257 | 16 | 16 | NO |
|  | 12 | 8 | YES |  | 32 | 8 | NO |
| 103 | 9 | 11 | YES |  |  |  |  |
|  | 10 | 10 | YES |  |  |  |  |
|  | 11 | 9 | YES |  |  |  |  |

Case where r=1 and s=4: $\mathcal{C}$ (m,n, 1,4; f(x))

Similar to the previous analysis, s=4 is written as all possible sums of odd numbers. There are three ways of doing so: 4=1+3, 4=3+1 and 4=1+1+1+1. Then, based on Theorem 1, Theorem 6 is:

Theorem 6. Code $\mathcal{C}$ (m, n, 1,4; f(x)) as given by Construction 1 is PMDS if and only if code $\mathcal{C}$ (m, n, 1,3; f(x)) is PMDS, and, for any $1 \leq i \leq m-1$, $0 \leq l_{1,0} < l_{1,1} \leq n-1$ and $0 \leq l_{2,0} < l_{2,1} < l_{2,2} < l_{2,3} \leq n-1$, $$gcd(1+x^{l_{1,1}-l_{1,0}}+x^{in+l_{2,0}-l_{1,0}}(1+x^{l_{2,1}-l_{2,0}}+x^{l_{2,2}-l_{2,0}}+ \\ x^{l_{2,3}-l_{2,0}}), f(x))=1, \qquad (10)$$

for any $1 \leq i \leq m-1$, $0 \leq l_{1,0} < l_{1,1} < l_{1,2} < l_{1,3} \leq n-1$ and $0 \leq l_{2,0} < l_{2,1} \leq n-1$, $$gcd(1+x^{l_{1,1}-l_{1,0}}+x^{l_{1,2}-l_{1,0}}+x^{l_{1,3}-l_{1,0}}+x^{in+l_{2,0}-l_{1,0}}(1+ \\ x^{l_{2,1}-l_{2,0}}), f(x))=1, \qquad (11)$$

and for any $1 \leq i_2 < i_3 < i_4 \leq m-1$, $0 \leq l_{1,0} < l_{1,1} \leq n-1$, $0 \leq l_{2,0} < l_{2,1} \leq n-1$, $0 \leq l_{3,0} < l_{3,1} \leq n-1$ and $0 \leq l_{4,0} < l_{4,1} \leq n-1$, $$gcd(1+x^{l_{1,1}-l_{1,0}}+x^{i_2n+l_{2,0}-l_{1,0}}(1+x^{l_{2,1}-l_{2,0}})+x^{i_3n+l_{3,0}-l_{1,0}}(1+ \\ x^{l_{3,1}-l_{3,0}})+x^{i_4n+l_{4,0}-l_{1,0}}(1+x^{l_{4,1}-l_{4,0}}), f(x))=1. \qquad (12)$$

Consider next a restricted situation for a code $\mathcal{C}$ (m, n, 1,4; f(x)). Contemporary codes have been constructed that can recover from an erased column together with a row with up to two errors, or two different rows with up to one error each. From a coding point of view, a $\mathcal{C}$ (m, n, 1,4; f(x)) code that is both 5-erasure correcting and (3,3)-erasure correcting will accomplish this (these conditions are actually stronger than those in contemporary codes since they do not require an erased column, as the erasures can be anywhere in the row).

Notice that, according to Lemma 2, a code $\mathcal{C}$ (m, n, 1,4; f(x)) is 5-erasure correcting, if and only if for any $1 \leq l_1 < l_2 < l_3 \leq n-1$, equation (8) holds. Also by Lemma 2, a code $\mathcal{C}$ (m, n, 1,4; f(x)) is (3,3)-erasure correcting, if and only if for any $1 \leq i \leq m-1$ and $0 \leq l_{1,0} < l_{1,1} \leq n-1$, $0 \leq l_{2,0} < l_{2,1} \leq n-1$, equation (7) holds.

Equation (7) is exactly the condition for code $\mathcal{C}$ (m, n, 1,2) to be PMDS by Theorem 4. This results in the following lemma.

Lemma 3. Code $\mathcal{C}$ (m, n, 1,4; f(x)) is both 5-erasure correcting and (3,3)-erasure correcting if and only if code $\mathcal{C}$ (m, n, 1,2; f(x)) is PMDS and, for any $1 \leq l_1 < l_2 < l_3 \leq n-1$, equation (8) holds.

As shown in Table 2, for the values of m, n and p for which $\mathcal{C}$ (m, n, 1,2; f(x)) is PMDS, equation (8) holds. Therefore, by Lemma 3, for such prime numbers p the codes $\mathcal{C}$ (m, n, 1,4; f(x)) are both 5-erasure correcting and (3,3)-erasure correcting.

Case where s=1: $\mathcal{C}$ (m, n, r, 1; f(x))

Thus far, cases where r=1 have been described. If r=s=1, then as described earlier, the code is PMDS. What follows is an examination of the case where r>1. Thus, assume that row i, $0 \leq i \leq m-1$, has r+1 erasures in locations $0 \leq j_0 < j_1 < \ldots < j_r \leq n-1$. The following theorem, Theorem 7 gives the conditions for the codes to be PMDS.

Theorem 7. Consider code $\mathcal{C}$ (m, n, r, 1; f(x)). If r is even, then $\mathcal{C}$ (m, n, r, 1; f(x)) is PMDS if and only if $\mathcal{C}$ (m, n, r 1,1; f(x)) is PMDS, while if r is odd, $\mathcal{C}$ (m, n, r, 1; f(x)) is PMDS if and only if $\mathcal{C}$ (m, n, r 1,1; f(x)) is PMDS and, for any $1 \leq l_1 < l_2 < \ldots < l_r \leq n-1$, $$gcd\left(1 + \sum_{u=1}^{r} x^{l_u}, f(x)\right) = 1 \qquad (13)$$

As described earlier, $\mathcal{C}$ (m, n, 1,1; f(x)) is PMDS. Thus, by Theorem 7, also $\mathcal{C}$ (m, n, 2,1; f(x)) is PMDS. According to equation (13), $\mathcal{C}$ (m, n, 3,1; f(x)) and $\mathcal{C}$ (m, n, 4,1; f(x)) are PMDS if and only if, for any $1 \leq l_1 < l_2 < l_3 \leq n-1$ and r=3, (8) holds.

Case where r=2 and s=1: $\mathcal{C}$ (m, n, 2, 2; f(x))

For $\mathcal{C}$ (m, n, 2,2; f(x)) to be PMDS, it has to be both 4-erasure-correcting and (3,3)-erasure-correcting. As described previously, $\mathcal{C}$ (m, n, 2,2; f(x)) is 4-erasure correcting if and only if, for any $1 \leq l_1 < l_2 < l_3 \leq n-1$, equation (8) holds. Also as described previously, this is equivalent to saying that code $\mathcal{C}$ (m, n, 3,1; f(x)) is PMDS. By examining the conditions under which code $\mathcal{C}$ (m, n, 2,2; f(x)) is (3,3)-erasure-correcting, the result is Theorem 8.

Theorem 8. Code $\mathcal{C}$ (m, n, 2,2; f(x)) is PMDS if and only if code $\mathcal{C}$ (m, n, 3,1; f(x)) is PMDS and, for any $1 \leq i \leq m-1$, $0 \leq l_{1,0} < l_{1,1} < l_{1,2} \leq n-1$ and $0 \leq l_{2,0} < l_{2,1} < l_{2,2} \leq n-1$, if $g(x) = 1 + x^{l_{1,1}-l_{1,0}} + x^{l_{1,2}-l_{1,0}} + x^{2(l_{1,1}-l_{1,0})} + x^{2(l_{1,2}-l_{1,0})} +$
$x^{(l_{1,1}-l_{1,0})(l_{1,2}-l_{1,0})} + x^{2(in+l_{2,0}-l_{1,0})}(1 + x^{l_{2,1}-l_{2,0}} +$
$x^{l_{2,2}-l_{2,0}} + x^{2(l_{2,1}-l_{2,0})} + x^{2(l_{2,2}-l_{2,0})} + x^{(l_{2,1}-l_{2,0})(l_{2,2}-l_{2,0})})$, then gcd (g(x), f(x))=1.

Alternate Construction

Following is a description of an embodiment of a PMDS code construction that is an alternative to Construction 1 described previously.

Construction 2. Consider the binary polynomials modulo f(x), where either f(x) is irreducible or $f(x)=1+x+\ldots+x^{p-1}$, p a prime number, and let $mn \leq e(f(x))$. Let $\mathcal{C}^{(1)}(m, n, r, s; f(x))$ be the code whose (mr+s)×mn parity-check matrix is:

$$\mathcal{H}^{(1)}(m, n, r, s) = \begin{pmatrix} H(n, r, 0, 0) & \underline{0}(n, r) & \underline{0}(n, r) & \ldots & \underline{0}(n, r) \\ \underline{0}(n, r) & H(n, r, 0, r) & \underline{0}(n, r) & \ldots & \underline{0}(n, r) \\ \underline{0}(n, r) & \underline{0}(n, r) & H(n, r, 0, 2r) & \ldots & \underline{0}(n, r) \\ \vdots & \vdots & \vdots & \ddots & \vdots \\ \underline{0}(n, r) & \underline{0}(n, r) & \underline{0}(n, r) & \ldots & H(n, r, 0, (m-1)r) \\ & & H(mn, s, r, 0) & & \end{pmatrix} \qquad (14)$$

where H(n, r, i, j) is the r×n matrix $$H(n, r, i, j) = \begin{pmatrix} \alpha^{ij} & \alpha^{i(j+1)} & \alpha^{i(j+2)} & \ldots & \alpha^{i(j+n-1)} \\ \alpha^{(i+1)j} & \alpha^{(i+1)(j+1)} & \alpha^{(i+1)(j+2)} & \ldots & \alpha^{(i+1)(j+n-1)} \\ \alpha^{(i+2)j} & \alpha^{(i+2)(j+1)} & \alpha^{(i+2)(j+2)} & \ldots & \alpha^{(i+2)(j+n-1)} \\ \vdots & \vdots & \vdots & \ddots & \vdots \\ \alpha^{(i+r-1)j} & \alpha^{(i+r-1)(j+1)} & \alpha^{(i+r-1)(j+2)} & \ldots & \alpha^{(i+r-1)(j+n-1)} \end{pmatrix} \qquad (15)$$

and $\underline{0}(n, r)$ is an r×n zero matrix.

Next, Construction 2 is illustrated with some examples. In the first example, m=3 and n=5. Then:

$$\mathcal{H}^{(1)}(3, 5, 1, 3) =$$

$$\begin{pmatrix} 1 & 1 & 1 & 1 & 1 & 0 & 0 & 0 & 0 & 0 & 0 & 0 & 0 & 0 & 0 \\ 0 & 0 & 0 & 0 & 0 & 1 & 1 & 1 & 1 & 1 & 0 & 0 & 0 & 0 & 0 \\ 0 & 0 & 0 & 0 & 0 & 0 & 0 & 0 & 0 & 0 & 1 & 1 & 1 & 1 & 1 \\ 1 & \alpha & \alpha^2 & \alpha^3 & \alpha^4 & \alpha^5 & \alpha^6 & \alpha^7 & \alpha^8 & \alpha^9 & \alpha^{10} & \alpha^{11} & \alpha^{12} & \alpha^{13} & \alpha^{14} \\ 1 & \alpha^2 & \alpha^4 & \alpha^6 & \alpha^8 & \alpha^{10} & \alpha^{12} & \alpha^{14} & \alpha^{16} & \alpha^{18} & \alpha^{20} & \alpha^{22} & \alpha^{24} & \alpha^{26} & \alpha^{28} \\ 1 & \alpha^3 & \alpha^6 & \alpha^9 & \alpha^{12} & \alpha^{15} & \alpha^{18} & \alpha^{21} & \alpha^{24} & \alpha^{27} & \alpha^{30} & \alpha^{33} & \alpha^{36} & \alpha^{39} & \alpha^{42} \end{pmatrix}$$

$\mathcal{H}^{(1)}(3, 5, 3, 1) =$ $$\begin{pmatrix} 1 & 1 & 1 & 1 & 1 & 0 & 0 & 0 & 0 & 0 & 0 & 0 & 0 & 0 & 0 \\ 1 & \alpha & \alpha^2 & \alpha^3 & \alpha^4 & 0 & 0 & 0 & 0 & 0 & 0 & 0 & 0 & 0 & 0 \\ 1 & \alpha^2 & \alpha^4 & \alpha^6 & \alpha^8 & 0 & 0 & 0 & 0 & 0 & 0 & 0 & 0 & 0 & 0 \\ 0 & 0 & 0 & 0 & 0 & 1 & 1 & 1 & 1 & 1 & 0 & 0 & 0 & 0 & 0 \\ 0 & 0 & 0 & 0 & 0 & \alpha^5 & \alpha^6 & \alpha^7 & \alpha^8 & \alpha^9 & 0 & 0 & 0 & 0 & 0 \\ 0 & 0 & 0 & 0 & 0 & \alpha^{10} & \alpha^{12} & \alpha^{14} & \alpha^{16} & \alpha^{18} & 0 & 0 & 0 & 0 & 0 \\ 0 & 0 & 0 & 0 & 0 & 0 & 0 & 0 & 0 & 0 & 1 & 1 & 1 & 1 & 1 \\ 0 & 0 & 0 & 0 & 0 & 0 & 0 & 0 & 0 & 0 & \alpha^{10} & \alpha^{11} & \alpha^{12} & \alpha^{13} & \alpha^{14} \\ 0 & 0 & 0 & 0 & 0 & 0 & 0 & 0 & 0 & 0 & \alpha^{20} & \alpha^{22} & \alpha^{24} & \alpha^{26} & \alpha^{28} \\ 1 & \alpha^3 & \alpha^6 & \alpha^9 & \alpha^{12} & \alpha^{15} & \alpha^{18} & \alpha^{21} & \alpha^{24} & \alpha^{27} & \alpha^{30} & \alpha^{33} & \alpha^{36} & \alpha^{39} & \alpha^{42} \end{pmatrix}$$

$\mathcal{H}^{(1)}(3, 5, 2, 2) =$ $$\begin{pmatrix} 1 & 1 & 1 & 1 & 1 & 0 & 0 & 0 & 0 & 0 & 0 & 0 & 0 & 0 & 0 \\ 1 & \alpha & \alpha^2 & \alpha^3 & \alpha^4 & 0 & 0 & 0 & 0 & 0 & 0 & 0 & 0 & 0 & 0 \\ 0 & 0 & 0 & 0 & 0 & 1 & 1 & 1 & 1 & 1 & 0 & 0 & 0 & 0 & 0 \\ 0 & 0 & 0 & 0 & 0 & \alpha^5 & \alpha^6 & \alpha^7 & \alpha^8 & \alpha^9 & 0 & 0 & 0 & 0 & 0 \\ 0 & 0 & 0 & 0 & 0 & 0 & 0 & 0 & 0 & 0 & 1 & 1 & 1 & 1 & 1 \\ 0 & 0 & 0 & 0 & 0 & 0 & 0 & 0 & 0 & 0 & \alpha^{10} & \alpha^{11} & \alpha^{12} & \alpha^{13} & \alpha^{14} \\ 1 & \alpha^2 & \alpha^4 & \alpha^6 & \alpha^8 & \alpha^{10} & \alpha^{12} & \alpha^{14} & \alpha^{16} & \alpha^{18} & \alpha^{20} & \alpha^{22} & \alpha^{24} & \alpha^{26} & \alpha^{28} \\ 1 & \alpha^3 & \alpha^6 & \alpha^9 & \alpha^{12} & \alpha^{15} & \alpha^{18} & \alpha^{21} & \alpha^{24} & \alpha^{27} & \alpha^{30} & \alpha^{33} & \alpha^{36} & \alpha^{39} & \alpha^{42} \end{pmatrix}$$

Note that $\mathcal{C}(m, n, 1, 2; f(x))$ and $\mathcal{C}^{(1)}(m, n, 1, 2; f(x))$ coincide. The analysis of some special cases follows.

Case where s=1: $\mathcal{C}^{(1)}(m, n, r, 1; f(x))$

Conditions under which conditions code $\mathcal{C}^{(1)}(m, n, r, 1; f(x))$ is (r+1)-erasure-correcting are now examined. Using parity-check matrix $\mathcal{H}^{(1)}(m, n, r, 1)$ as defined by equation (14), $\mathcal{C}^{(1)}(m, n, r, 1; f(x))$ is (r+1)-erasure-correcting if and only if, for any $0 \leq i \leq m-1$ and for any $1 \leq j_0 < j_1 < \ldots < j_r$, the Vandermonde determinant $$\det \begin{pmatrix} 1 & 1 & \ldots & 1 \\ \alpha^{in+j_0} & \alpha^{in+j_1} & \ldots & \alpha^{in+j_r} \\ \alpha^{2(in+j_0)} & \alpha^{2(in+j_1)} & \ldots & \alpha^{2(in+j_r)} \\ \alpha^{3(in+j_0)} & \alpha^{3(in+j_1)} & \ldots & \alpha^{3(in+j_r)} \\ \vdots & \vdots & \ddots & \vdots \\ \alpha^{r(in+j_0)} & \alpha^{r(in+j_1)} & \ldots & \alpha^{r(in+j_r)} \end{pmatrix} = \prod_{0 \leq t < l \leq r} (\alpha^{in+j_t} \oplus \alpha^{in+j_l})$$

is invertible. Since $\alpha^{in+j_t} \neq \alpha^{in+j_l}$ for $0 \leq t < l \leq r$, when f(x) is irreducible $\alpha^{in+j_t} \oplus \alpha^{in+j_l}$ is invertible. When $f(x) = 1 + x + \ldots + x^{p-1}$, p a prime, and f(x) is reducible, then $\alpha^{in+j_t} \oplus \alpha^{in+j_l}$ is also invertible. This results in Theorem 9.

Theorem 9. Code $\mathcal{C}^{(1)}(m, n, r, 1; f(x))$ is PMDS.

Comparing Theorems 7 and 9, it is concluded that codes $\mathcal{C}^{(1)}(m, n, r, 1; f(x))$ are preferable to codes $\mathcal{C}(m, n, r, 1; f(x))$ for $r \geq 2$, since the former are PMDS without restrictions.

Case where r=1 and s=3: $\mathcal{C}^{(1)}(m, n, 1, 3; f(x))$

The following theorem holds.

Theorem 10. Code $\mathcal{C}^{(1)}(m, n, 1, 3; f(x))$ as given by Construction 2 is PMDS if and only if, for any $0 \leq i_1 \neq i_2 \leq m-1$, $0 \leq l_{1,0} < l_{1,1} < l_{1,2} \leq n-1$ and $0 \leq l_{2,0} < l_{2,1} \leq n-1$, $f(\alpha) = 0$, the following matrix is invertible, $$\begin{pmatrix} 1 \oplus \alpha^{l_{1,1}-l_{1,0}} & 1 \oplus \alpha^{l_{1,2}-l_{1,0}} & \alpha^{(i_2-i_1)n+l_{2,0}-l_{1,0}}(1 \oplus \alpha^{l_{2,1}-l_{2,0}}) \\ 1 \oplus \alpha^{2(l_{1,1}-l_{1,0})} & 1 \oplus \alpha^{2(l_{1,2}-l_{1,0})} & \alpha^{2((i_2-i_1)n+l_{2,0}-l_{1,0})}(1 \oplus \alpha^{2(l_{2,1}-l_{2,0})}) \\ 1 \oplus \alpha^{3(l_{1,1}-l_{1,0})} & 1 \oplus \alpha^{3(l_{1,2}-l_{1,0})} & \alpha^{3((i_2-i_1)n+l_{2,0}-l_{1,0})}(1 \oplus \alpha^{3(l_{2,1}-l_{2,0})}) \end{pmatrix} \quad (16)$$

and for any $1 \leq i_2 < i_3 \leq m-1$, $0 \leq l_{1,0} < l_{1,1} \leq n-1$, $0 \leq l_{2,0} < l_{2,1} \leq n-1$ and $0 \leq l_{3,0} < l_{3,1} \leq n-1$, the following matrix is invertible:

$$\begin{pmatrix} 1 \oplus \alpha^{l_{1,1}-l_{1,0}} & \alpha^{i_2n+l_{2,0}-l_{1,0}}(1 \oplus \alpha^{l_{2,1}-l_{2,0}}) & \alpha^{i_3n+l_{3,0}-l_{1,0}}(1 \oplus \alpha^{l_{3,1}-l_{3,0}}) \\ 1 \oplus \alpha^{2(l_{1,1}-l_{1,0})} & \alpha^{2(i_2n+l_{2,0}-l_{1,0})}(1 \oplus \alpha^{2(l_{2,1}-l_{2,0})}) & \alpha^{2(i_3n+l_{3,0}-l_{1,0})}(1 \oplus \alpha^{2(l_{3,1}-l_{3,0})}) \\ 1 \oplus \alpha^{3(l_{1,1}-l_{1,0})} & \alpha^{3(i_2n+l_{2,0}-l_{1,0})}(1 \oplus \alpha^{3(l_{2,1}-l_{2,0})}) & \alpha^{3(i_3n+l_{3,0}-l_{1,0})}(1 \oplus \alpha^{3(l_{3,1}-l_{3,0})}) \end{pmatrix} \quad (17)$$

Consider $f(x) = 1 + x + \ldots + x^{p-1}$, p a prime number. All prime numbers p such that 2 is primitive in GF(p) up to p=227 were tested (i.e., f(x) is irreducible), and the matrices given by equations (16) and (17) are invertible in all instances. This results in Lemma 4.

Lemma 4. Consider the code $\mathcal{C}^{(1)}(m, n, 1, 3; f(x))$ given by Construction 2 over the field of elements modulo $f(x) = 1 + x + \ldots + x^{p-1}$ such that p is a prime number and f(x) is irreducible (or equivalently, 2 is primitive in GF(p)). Then, for $19 \leq p \leq 227$, code $\mathcal{C}^{(1)}(m, n, 1, 3; f(x))$ is PMDS.

For values of p such that 2 is not primitive in GF(p), some results are tabulated in Table 4 for different values of m and n. This table is very similar to Table 3.

TABLE 4

| Prime | m | n $\mathcal{C}^{(1)}$ | (m, n, 1, 3; f(x)) PMDS? |
|---|---|---|---|
| 7 | 4 | 4 | NO |
| 23 | 3 | 7 | NO |
| | 4 | 5 | YES |
| 31 | 5 | 6 | NO |
| | 6 | 5 | NO |
| 41 | 5 | 8 | NO |
| | 6 | 6 | YES |
| | 8 | 5 | YES |
| 43 | 5 | 8 | NO |
| | 6 | 7 | NO |
| 47 | 4 | 11 | YES |
| | 5 | 9 | YES |
| 71 | 7 | 10 | YES |
| | 8 | 8 | YES |
| | 10 | 7 | YES |
| 73 | 6 | 12 | NO |
| | 7 | 10 | NO |
| | 8 | 9 | NO |
| | 9 | 8 | NO |
| 79 | 6 | 13 | YES |
| | 7 | 11 | YES |
| | 8 | 9 | YES |
| 89 | 8 | 11 | NO |
| | 9 | 9 | NO |
| | 11 | 8 | NO |
| 97 | 8 | 12 | YES |
| | 10 | 9 | YES |
| | 12 | 8 | YES |
| 103 | 9 | 11 | YES |
| | 10 | 10 | YES |
| | 11 | 9 | YES |
| 109 | 9 | 12 | YES |
| | 10 | 10 | YES |
| | 12 | 9 | YES |
| 113 | 10 | 11 | NO |
| | 11 | 10 | NO |
| | 12 | 9 | NO |
| 127 | 11 | 11 | NO |
| | 13 | 9 | NO |
| 137 | 11 | 12 | YES |
| | 12 | 11 | YES |
| | 13 | 10 | YES |
| | 15 | 9 | YES |
| | 16 | 8 | YES |
| 151 | 15 | 10 | NO |
| | 16 | 9 | NO |
| 157 | 12 | 13 | YES |
| | 13 | 12 | YES |
| | 16 | 9 | YES |
| 167 | 16 | 10 | YES |
| 191 | 17 | 11 | YES |
| 193 | 16 | 12 | YES |
| 199 | 16 | 12 | YES |
| 223 | 17 | 13 | YES |
| 229 | 16 | 14 | YES |
| | 28 | 8 | YES |
| 233 | 23 | 10 | YES |
| 239 | 26 | 9 | YES |
| 241 | 24 | 10 | NO |
| 251 | 25 | 10 | YES |
| 257 | 16 | 16 | NO |
| | 32 | 8 | NO |

Actually, comparing Table 3 and Table 4, it can be seen that for values of p, m and n for which $\mathcal{C}^{(1)}(m,n, 1,3; f(x))$ is PMDS, also $\mathcal{C}(m, n, 1,3; f(x))$ is PMDS. However, for p=23, $\mathcal{C}(3,7,1,3; f(x))$ is PMDS but $\mathcal{C}^{(1)}(3,7,1,3; f(x))$ is not, for p=41, $\mathcal{C}(5,8,1,3; f(x))$ is PMDS but $\mathcal{C}^{(1)}(5,8,1,3; f(x))$ is not, and for p=113, $\mathcal{C}(3,7,10,11; f(x))$, $\mathcal{C}(3,7,11,10; f(x))$ and $\mathcal{C}(3,7,12,9; f(x))$ are PMDS but $\mathcal{C}^{(1)}(3,7,10,11; f(x))$, $\mathcal{C}^{(1)}(3,7,11,10; f(x))$ and $\mathcal{C}^{(1)}(3,7,12,9; f(x))$ are not.

The following description includes additional code constructions and descriptions of embodiments of PMDS codes.

Technical effects and benefits include PMDS codes that are suitable for a flash array type of architecture, in which hard errors co-exist with catastrophic device failures. Described herein are specific codes that are useful in applications, as well as necessary and sufficient conditions for PMDS codes satisfying an optimality criterion. Technical effects and benefits also include the ability to provide the same protection as a redundant array of independent disks RAID 6, but with storage efficiency approaching that of RAID 5. Thus, an embodiment may be utilized to maximize the protection against stripe failures for a given amount of redundancy.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A system for storing data in a storage array, the system comprising:
   a storage array comprising a plurality of storage devices; and
   an array controller configured for:
      receiving write data;
      arranging the write data in an array that includes m rows and n columns of entries, each entry comprising at least one sector;
      assigning mr+s locations in the array to parity entries, such that there are at least r parity entries for each row, and further such that the parity entries correspond to a partial-maximum distance separable (PMDS) code, such code allowing recovery from up to r erasures in each of the m rows as well as s additional erasures in any locations in the data array, where s and r are integers greater than zero; and
      writing the write data and the associated parity entries to the set of storage devices,
   wherein s is less than m.

2. The system of claim 1, wherein the data and parity entries are in a field or ring with b elements, the field or ring generated by a polynomial f(x) of degree b, and wherein the product of m and n is smaller than the exponent of f(x).

3. The system of claim 1, wherein r=1.

4. The system of claim 1, wherein m−1 rows contain exactly r parity entries each and one row contains r+s parity entries.

5. The system of claim 4, wherein the r parity entries in each of the m−1 rows containing exactly r parity entries are obtained using an [n,n−r] maximum distance separable (MDS) code, and the remaining r+s parity entries are obtained by solving a system of r+s equations with r+s unknowns based on the write data, the previously obtained parity entries and a parity-check matrix corresponding to a PMDS code.

6. The system of claim 1, wherein the parity entries are computed by solving a linear system of mr+s equations with mr+s unknowns, the linear system based on the write data and on a parity-check matrix corresponding to a PMDS code.

7. The system of claim 6, wherein the parity-check matrix is an (m+s)×(mn) matrix, such that:
- a jth row, where j is at most m, includes (j−1)m 0s followed by m 1s and followed by 0s,
- an (m+1)-th row includes a 1, followed by $\alpha$, followed by $\alpha^2$, and so on, up to the last symbol of the row, which is $\alpha_{mn-1}$, where $\alpha$ is a root of f(x), and
- an (m+i)-th row, where i is a number between 2 and s, includes the entries of the (m+1)-th row taken to the power $2^{i-1}$.

8. The system of claim 6, wherein the parity-check matrix is an (m+s)×(mn) matrix, such that:
- a jth row, where j is at most m, includes (j−1)m 0s followed by m 1s and followed by 0s,
- an (m+1)-th row includes a 1, followed by $\alpha$, followed by $\alpha^2$, and so on, up to the last symbol of the row, which is $\alpha_{mn-1}$, where $\alpha$ is a root of f(x), and
- an (m+i)-th row, where i is a number between 2 and s, includes the entries of the (m+1)-th row taken to the power i.

9. A method for storing data on a set of n storage devices, the method comprising:
- receiving write data;
- arranging the write data in an array that includes m rows and n columns of entries, each entry comprising at least one sector;
- assigning mr+s locations in the array to parity entries, such that there are at least r parity entries for each row, and further such that the parity entries correspond to a partial-maximum distance separable (PMDS) code, such code allowing recovery from up to r erasures in each of the m rows as well as s additional erasures in any locations in the data array, where s and r are integers greater than zero; and
- writing the write data and the associated parity entries to the set of storage devices,
- wherein s is less than m.

10. The method of claim 9, wherein the parity entries are computed by solving a linear system of mr+s equations with mr+s unknowns, the linear system based on the write data and on a parity-check matrix corresponding to a PMDS code.

11. The method of claim 10, wherein the parity-check matrix is an (m+s)×(mn) matrix, such that:
- a jth row, where j is at most m, includes (j−1)m 0s followed by m 1s and followed by 0s,
- an (m+1)-th row includes a 1, followed by $\alpha$, followed by $\alpha^2$, and so on, up to the last symbol of the row, which is $\alpha^{mn-1}$, where $\alpha$ is a root of f(x), and
- an (m+i)-th row, where i is a number between 2 and s, includes the entries of the (m+1)-th row taken to the power $2^{i-1}$.

12. The method of claim 10, wherein the parity-check matrix is an (m+s)×(mn) matrix, such that:
- a jth row, where j is at most m, includes (j−1)m 0s followed by m 1s and followed by 0s,
- an (m+1)-th row includes a 1, followed by $\alpha$, followed by $\alpha^2$, and so on, up to the last symbol of the row, which is $\alpha^{mn-1}$, where $\alpha$ is a root of f(x),
- an (m+i)-th row, where i is a number between 2 and s, includes the entries of the (m+1)-th row taken to the power i.

13. The method of claim 9, wherein the write data and parity entries are in a field or ring with b elements, the field or ring generated by a polynomial f(x) of degree b, and wherein the product of m and n is smaller than the exponent of f(x).

14. The method of claim 13, wherein f(x) is the polynomial $M_p(x)=1+x+x^2+\ldots+x^{p-1}$ and p is a prime number.

15. The method of claim 9 wherein r=1.

16. The method of claim 9, wherein m−1 rows contain exactly r parity entries each and one row contains r+s parity entries.

17. The method of claim 16, wherein the r parity entries in each of the m−1 rows containing exactly r parity entries are obtained using an [n,n−r] maximum distance separable (MDS) code, and the remaining r+s parity entries are obtained by solving a system of r+s equations with r+s unknowns based on the write data, the previously obtained parity entries and a parity-check matrix corresponding to a PMDS code.

18. A computer program product for storing data in a storage array, the computer program product comprising:
- a non-transitory computer readable storage medium having computer readable program code embodied therewith, the computer readable program code comprising:
- computer readable program code configured for:
  - receiving write data;
  - arranging the write data in an array that includes m rows and n columns of entries, each entry comprising at least one sector;
  - assigning mr+s locations in the array to parity entries, such that there are at least r parity entries for each row, and further such that the parity entries correspond to a partial-maximum distance separable (PMDS) code, such code allowing recovery from up to r erasures in each of the m rows as well as s additional erasures in any locations in the data array, where s and r are integers greater than zero; and
  - writing the write data and the associated parity entries to the set of storage devices,
- wherein s is less than m.

19. The computer program product of claim 18, wherein the data and parity entries are in a field or ring with b elements, the field or ring generated by a polynomial f(x) of degree b and wherein the product of m and n is smaller than the exponent of f(x).

20. The computer program product of claim 18, wherein r=1.

21. The computer program product of claim 18, wherein m−1 rows contain exactly r parity entries each and one row contains r+s parity entries.

22. The computer program product of claim 21, wherein the r parity entries in each of the m−1 rows containing exactly r parity entries are obtained using an [n,n−r] maximum distance separable (MDS) code, and the remaining r+s parity entries are obtained by solving a system of r+s equations with r+s unknowns based on the write data, the previously obtained parity entries and a parity-check matrix corresponding to the PMDS code.

* * * * *